United States Patent
Aoki et al.

(10) Patent No.: US 11,608,554 B2
(45) Date of Patent: Mar. 21, 2023

(54) DEPOSITION MASK APPARATUS, MASK SUPPORT MECHANISM, AND PRODUCTION METHOD FOR DEPOSITION MASK APPARATUS

(71) Applicant: Dai Nippon Printing Co., Ltd., Tokyo (JP)

(72) Inventors: Daigo Aoki, Tokyo (JP); Chikao Ikenaga, Tokyo (JP); Isao Inoue, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 17/649,683

(22) Filed: Feb. 2, 2022

(65) Prior Publication Data
US 2022/0162738 A1    May 26, 2022

Related U.S. Application Data

(62) Division of application No. 16/783,260, filed on Feb. 6, 2020, now Pat. No. 11,279,999.

(30) Foreign Application Priority Data

Feb. 6, 2019   (JP) .............................. JP2019-019835

(51) Int. Cl.
*C23C 14/04* (2006.01)
*C23C 14/24* (2006.01)
(Continued)

(52) U.S. Cl.
CPC .......... *C23C 14/042* (2013.01); *B05C 21/005* (2013.01); *C23C 14/24* (2013.01); *H01L 51/001* (2013.01); *H01L 51/0011* (2013.01)

(58) Field of Classification Search
None
See application file for complete search history.

(56) References Cited

U.S. PATENT DOCUMENTS

| 6,858,086 B2 * | 2/2005 | Kang ................... C23C 14/042 204/298.11 |
| 6,866,720 B2 * | 3/2005 | Kim ..................... C23C 14/042 118/301 |

(Continued)

FOREIGN PATENT DOCUMENTS

| CN | 107723659 A | 2/2018 |
| CN | 208279677 U | 12/2018 |
| JP | 5382259 B1 | 1/2014 |

OTHER PUBLICATIONS

Extended European Search Report (Application No. 20155572.9) dated Jun. 19, 2020.
(Continued)

*Primary Examiner* — Jethro M. Pence
(74) *Attorney, Agent, or Firm* — Burr Patent Law, PLLC

(57) ABSTRACT

A deposition mask apparatus including a frame, a supporter including a plurality of supporting members fixed to the frame, and a deposition mask fixed to the frame is provided. The plurality of supporting members include at least a first supporting member that is closest to an intermediate position between a third portion and a fourth portion of the frame and a second supporting member that is located closer to the third portion of the frame than the first supporting member. The first supporting member in a state of warping downward from the frame with a first warping amount supports the deposition mask from below. The second supporting member in a state of warping downward from the frame with a second warping amount that is smaller than the first warping amount supports the deposition mask from below.

9 Claims, 11 Drawing Sheets

(51) Int. Cl.
*H01L 51/00* (2006.01)
*B05C 21/00* (2006.01)

(56) References Cited

U.S. PATENT DOCUMENTS

| | | | | |
|---|---|---|---|---|
| 6,955,726 B2* | 10/2005 | Kang | ............... | C23C 14/042 118/721 |
| 7,029,535 B1* | 4/2006 | Bechtold, Jr. | ............ | B05B 12/24 118/504 |
| 7,572,338 B2* | 8/2009 | Kim | ............... | C23C 14/042 118/620 |
| 7,843,552 B2* | 11/2010 | Bruls | ............... | G03F 7/70783 355/75 |
| 7,987,812 B2* | 8/2011 | Kim | ............... | B05B 12/20 118/504 |
| 8,646,406 B2* | 2/2014 | Ahn | ............... | H01L 51/0011 118/301 |
| 8,851,009 B2* | 10/2014 | Lee | ............... | H01L 51/56 427/164 |
| 9,284,638 B2* | 3/2016 | Ko | ............... | B05C 21/005 |
| 9,500,962 B2* | 11/2016 | Kim | ............... | H01L 51/0011 |
| 9,673,424 B2* | 6/2017 | Han | ............... | C23C 14/042 |
| 9,859,495 B2* | 1/2018 | Kang | ............... | B05C 21/005 |
| 10,083,997 B2* | 9/2018 | Kim | ............... | H01L 51/0011 |
| 10,141,511 B2* | 11/2018 | Kim | ............... | H01L 27/3244 |
| 10,186,662 B2* | 1/2019 | Kim | ............... | H01L 51/56 |
| 10,290,807 B2* | 5/2019 | Kim | ............... | H01L 51/0011 |
| 10,344,376 B2* | 7/2019 | Hong | ............... | C23C 14/042 |
| 10,437,144 B2* | 10/2019 | Zhang | ............... | C23C 14/12 |
| 10,533,245 B2* | 1/2020 | Chang | ............... | C23C 14/042 |
| 10,570,499 B2* | 2/2020 | Lin | ............... | C23C 14/042 |
| 10,663,857 B2* | 5/2020 | Lv | ............... | H01L 51/5012 |
| 10,774,415 B2* | 9/2020 | Lin | ............... | C23C 14/042 |
| 10,787,730 B2* | 9/2020 | Lin | ............... | B05C 21/005 |
| 10,787,731 B2* | 9/2020 | Xie | ............... | C23C 14/042 |
| 10,818,877 B2* | 10/2020 | Hong | ............... | H01L 27/3223 |
| 10,868,268 B2* | 12/2020 | Kim | ............... | H01L 51/5203 |
| 10,920,311 B2* | 2/2021 | Kudo | ............... | B23K 11/11 |
| 10,982,314 B2* | 4/2021 | Lin | ............... | B05D 1/32 |
| 11,021,784 B2* | 6/2021 | Wang | ............... | C23C 14/042 |
| 11,136,664 B2* | 10/2021 | Uchida | ............... | C23C 14/042 |
| 11,237,481 B2* | 2/2022 | Oka | ............... | C22C 38/08 |
| 11,313,026 B2* | 4/2022 | Ikenaga | ............... | B05C 21/005 |
| 11,380,546 B2* | 7/2022 | Ushikusa | ............... | C23C 14/24 |
| 11,396,030 B2* | 7/2022 | Lee | ............... | C23C 16/042 |
| 11,414,739 B2* | 8/2022 | Lin | ............... | G03F 7/2014 |
| 2002/0062785 A1 | 5/2002 | Kim et al. | | |
| 2003/0101932 A1 | 6/2003 | Kang | | |
| 2003/0221614 A1 | 12/2003 | Kang et al. | | |
| 2005/0280789 A1 | 12/2005 | Bruls et al. | | |
| 2006/0103289 A1 | 5/2006 | Kim et al. | | |
| 2009/0127236 A1* | 5/2009 | Hong | ............... | G03F 7/12 219/121.64 |
| 2011/0139069 A1 | 6/2011 | Ahn et al. | | |
| 2012/0325143 A1 | 12/2012 | Kang | | |
| 2016/0079568 A1 | 3/2016 | Han | | |
| 2017/0056911 A1 | 3/2017 | Kang | | |
| 2017/0207390 A1 | 7/2017 | Kim et al. | | |
| 2018/0209029 A1 | 7/2018 | Lin et al. | | |
| 2018/0239241 A1 | 8/2018 | Lv et al. | | |
| 2019/0010599 A1 | 1/2019 | Lin et al. | | |
| 2019/0078193 A1 | 3/2019 | Lin | | |
| 2019/0256965 A1* | 8/2019 | Ikenaga | ............... | C30B 25/04 |
| 2020/0017950 A1* | 1/2020 | Oka | ............... | C21D 8/0236 |
| 2020/0019056 A1* | 1/2020 | Ikenaga | ............... | C21D 8/0278 |
| 2020/0149139 A1* | 5/2020 | Oka | ............... | H01L 51/0096 |
| 2020/0199733 A1* | 6/2020 | Uchida | ............... | H01L 51/56 |
| 2020/0273735 A1* | 8/2020 | Ikenaga | ............... | C23C 14/042 |
| 2020/0308688 A1* | 10/2020 | Ikenaga | ............... | C23C 14/12 |
| 2021/0210735 A1* | 7/2021 | Kang | ............... | H01L 51/56 |
| 2021/0214837 A1* | 7/2021 | Ikenaga | ............... | B05C 21/005 |
| 2021/0340665 A1* | 11/2021 | Uchida | ............... | H01L 51/0011 |
| 2022/0121115 A1* | 4/2022 | Oka | ............... | H01L 51/50 |
| 2022/0205077 A1* | 6/2022 | Ikenaga | ............... | C30B 25/04 |

OTHER PUBLICATIONS

Chinese Office Action (with English translation) dated Oct. 25, 2022 (Application No. 2020 10081387.3).

* cited by examiner

DEPOSITION MASK APPARATUS, MASK SUPPORT MECHANISM, AND PRODUCTION METHOD FOR DEPOSITION MASK APPARATUS

CROSS-REFERENCE TO RELATED APPLICATIONS

This application is a division of U.S. application Ser. No. 16/783,260, filed Feb. 6, 2020, and claims the benefit of priority from Japanese Patent Application No. 2019-019835, filed Feb. 6, 2019, the entireties of which are incorporated herein by reference.

FIELD OF THE INVENTION

Embodiments of the present disclosure relate to a deposition mask apparatus, a mask support mechanism, and a production method for a deposition mask apparatus.

BACKGROUND OF THE INVENTION

In electronic devices such as smartphones and tablet PCs, high-definition display devices are demanded from the market. A display device has a pixel density of, for example, 400 ppi or more or 800 ppi or more.

Attention has been paid to the organic EL display device because of its excellent responsibility and/or high contrast. A known method for forming pixels of the organic EL display device is attaching a material that constitutes pixels on a substrate by vapor deposition. In this case, first, a deposition mask apparatus including a deposition mask having holes and a frame that supports the deposition mask is prepared. Next, the deposition mask of the deposition mask apparatus is placed in contact with a substrate in the deposition apparatus. Then, an organic material and/or inorganic material or the like is deposited on the substrate, thereby forming an organic material and/or inorganic material or the like on the substrate.

During the vapor deposition step, the dimensional accuracy of the organic material on the substrate and/or the accuracy of the position of the organic material on the substrate may be reduced due to the presence of a gap between the deposition mask and the substrate. The cause of the gap is that the deposition mask warps by its own weight. In order to solve such a problem, it is known that a deposition mask, a substrate, and a magnet are arranged in that order, thereby drawing the deposition mask toward the substrate using magnetic force.

PRIOR ART DOCUMENTS

Patent Documents

Patent Document 1: Japanese Patent No. 5382259

SUMMARY OF THE INVENTION

Technical Problem

Depending on the form of warping generated in the deposition mask, the gap between the deposition mask and the substrate may not be sufficiently reduced even when a magnet or the like is used.

An object of an embodiment of the present disclosure is to reduce a gap between a deposition mask and a substrate.

Solution to Problem

A deposition mask apparatus in one embodiment of the present disclosure includes:

a frame including a first portion, a second portion facing the first portion across an opening in a first direction, a third portion, and a fourth portion facing the third portion across the opening in a second direction different from the first direction, and including a first surface and a second surface that is located opposite to the first surface;

a supporter including a plurality of supporting members that are arranged in the second direction, the supporting member including a first end that is fixed to the first portion on the first surface side and a second end that is fixed to the second portion on the first surface side; and a deposition mask including a third end that is fixed to the third portion on the first surface side and a fourth end that is fixed to the fourth portion on the first surface side, and including a plurality of holes that are located between the third end and the fourth end, in which the plurality of supporting members include at least a first supporting member that is closest to an intermediate position between the third portion and the fourth portion of the frame and a second supporting member that is located closer to the third portion of the frame than the first supporting member, and when the first surface of the frame is located above the second surface, the first supporting member in a state of warping downward from the frame with a first warping amount supports the deposition mask from below, and the second supporting member in a state of warping downward from the frame with a second warping amount that is smaller than the first warping amount supports the deposition mask from below.

Advantageous Effects of Embodiment

According to the deposition mask apparatus of the embodiment of the present disclosure, the gap between the deposition mask and the substrate can be reduced.

DETAILED DESCRIPTION OF THE INVENTION

Figure 1:
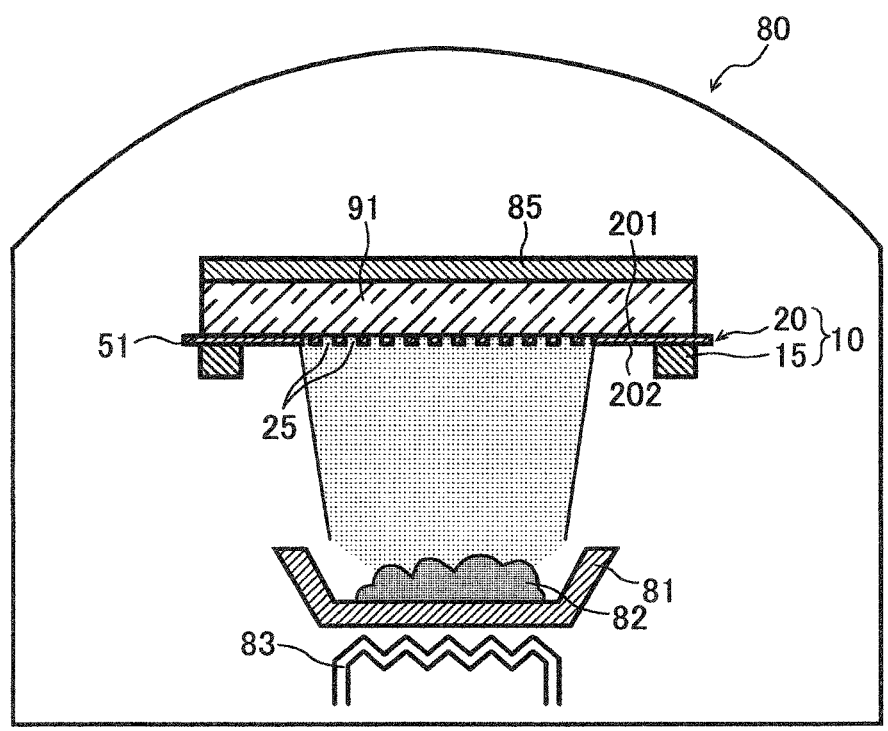
FIG. 1 is a view for illustrating a deposition apparatus including a deposition mask apparatus according to one embodiment of the disclosure.

In the present specification and the drawings, unless otherwise specified, terms each meaning a substance that is the basis of a certain structure, e.g., "substrate", "base member", "plate", "sheet", and "film" are not distinguished from each other based solely on the difference in designation.

In the present specification and the drawings, unless otherwise specified, terms specifying shapes, geometric conditions, and their degrees, e.g., "parallel" and "perpendicular" and values of lengths, angles, and the like are not limited to their strict definitions, but construed to include a range of capable of exerting a similar function.

In the present specification and the drawings, unless otherwise specified, when a certain structure of a certain member, a certain region, or the like is "above" or "below", "on the upper side of" or "on the lower side of", or "upward toward" or "downward toward" another structure of another member, another region, or the like, it includes a case in which a certain structure is in direct contact with another structure. Further, this also includes a case in which further structure is included between a certain structure and another structure, which means a case in which they are indirectly in contact with each other. Unless otherwise specified, the terms "above," "upper side", or "upward" and "below", "lower side", or "downward" may be interchangeable when the vertical direction is reversed.

In the present specification and the drawings, unless otherwise specified, the same portions or portions including similar functions are denoted by the same reference numerals or similar reference numerals, and repeated description thereof may be omitted. In addition, the dimensional ratios in the drawings may be different from actual ratios for convenience of description, or some of the components may be omitted from the drawings.

In the present specification and the drawings, unless otherwise specified, the embodiments and examples may be combined with other embodiments and modified examples unless there is contradiction. Further, the other embodiments, or other embodiments and modified examples may be combined unless there is contradiction. Further, the modified examples may be combined with each other unless there is contradiction.

In the present specification and the drawings, unless otherwise specified, when a plurality of steps are disclosed in relation to a method such as a production method, other steps that are not disclosed may be performed between the disclosed steps. In addition, the order of the disclosed steps is appropriately modified unless there is contradiction.

In the present specification and the drawings, unless otherwise specified, the numerical ranges expressed by the sign "-" include numerical values placed before and after the sign "-". For example, the numerical range defined by the expression "34%-38% by mass" is the same as the numerical range defined by the expression "34% or more and 38% or less by mass".

In one embodiment described herein, an example relating to a deposition mask used for patterning an organic material on a substrate in a desired pattern when producing an organic EL display device and a method for producing the same will be described. However, without being limited to such an application, the present embodiment can be applied to a deposition mask used for various uses. For example, the mask of the embodiment may be used to produce an apparatus for displaying or projecting an image or video for expressing virtual reality, so-called VR, or augmented reality, so-called AR.

A first aspect of the present disclosure is a deposition mask apparatus which includes:

a frame including a first portion, a second portion facing the first portion across an opening in a first direction, a third portion, and a fourth portion facing the third portion across the opening in a second direction different from the first direction, and including a first surface and a second surface that is located opposite to the first surface;

a supporter including a plurality of supporting members that are arranged in the second direction, the supporting member including a first end that is fixed to the first portion on the first surface side and a second end that is fixed to the second portion on the first surface side; and a deposition mask including a third end that is fixed to the third portion on the first surface side and a fourth end that is fixed to the fourth portion on the first surface side, and including a plurality of holes that are located between the third end and the fourth end, in which the plurality of supporting members include at least a first supporting member that is closest to an intermediate position between the third portion and the fourth portion of the frame and a second supporting member that is located closer to the third portion of the frame than the first supporting member, and when the first surface of the frame is located above the second surface, the first supporting member in a state of warping downward from the frame with a first warping amount supports the deposition mask from below, and the second supporting member in a state of warping downward from the frame with a second warping amount that is smaller than the first warping amount supports the deposition mask from below.

According to a second aspect of the present disclosure, in the deposition mask apparatus in the first aspect described above, the plurality of supporting members includes a third supporting member that is located closer to the fourth portion of the frame than the first supporting member, and when the first surface of the frame is located above the second surface, the third supporting member in a state of warping downward from the frame with a third warping amount that is smaller than the first warping amount may support the deposition mask from below.

According to a third aspect of the present disclosure, in the deposition mask apparatus in the second aspect described above, the plurality of supporting members include a fourth supporting member that is located closer to the third portion of the frame than the second supporting member and a fifth supporting member that is located closer to the fourth portion of the frame than the third supporting member, and when the first surface of the frame is located above the second surface, the fourth supporting member in a state of warping downward from the frame with a fourth warping amount that is smaller than the second warping amount may support the deposition mask from below, and the fifth supporting member in a state of warping downward from the frame with a fifth warping amount that is smaller than the third warping amount may support the deposition mask from below.

According to a fourth aspect of the present disclosure, in the deposition mask apparatus of each of the first to third aspects described above, the supporting members may have a thickness that is larger than a thickness of the deposition mask at a position where the deposition mask overlaps the supporting member in plan view.

According to a fifth aspect of the present disclosure, in the deposition mask apparatus of each of the first to third aspects described above, the supporting members may have a thickness that is twice or more of a thickness of the deposition mask at a position where the deposition mask overlaps the supporting member in plan view.

According to a sixth aspect of the present disclosure, in the deposition mask apparatus of each of the first to fifth aspects described above, the supporting members may have a thickness of 50 μm or more.

According to a seventh aspect of the present disclosure, in the deposition mask apparatus of each of the first to sixth aspects described above, the supporting members may have a thickness that is 50 times or less a thickness of the deposition mask at a position where the deposition mask overlaps the supporting member in plan view.

According to an eighth aspect of the present disclosure, in the deposition mask apparatus of each of the first to seventh aspects described above, the supporting members may have a thickness of 1 mm or less.

According to a ninth aspect of the present disclosure, in the deposition mask apparatus of each of the first to eighth aspects described above, the frame has a third surface facing the opening, the third surface being located between the first surface and the second surface, and the third surface of the first portion at a position where the first portion overlaps the first supporting member in plan view may be located closer to the second portion than the third surface of the first portion at a position where the first portion overlaps the second supporting member in plan view.

According to a tenth aspect of the present disclosure, in the deposition mask apparatus of each of the first to ninth aspects described above, the first portion and the second portion of the frame may be shorter than the third portion and the fourth portion of the frame.

According to an eleventh aspect of the present disclosure, in the deposition mask apparatus of each of the first to tenth aspects described above, a ratio of a length of the third portion and the fourth portion to a length of the first portion and the second portion may be 1.1 or more.

A twelfth aspect of the present disclosure is a mask support mechanism for supporting a deposition mask which includes:

a frame including a first portion, a second portion facing the first portion across an opening in a first direction, a third portion, and a fourth portion facing the third portion across the opening in a second direction different from the first direction, and including a first surface and a second surface that is located opposite to the first surface; and a supporter including a plurality of supporting members that are arranged in the second direction, the supporting member including a first end that is fixed to the first portion on the first surface side and a second end that is fixed to the second portion on the first surface side, in which the plurality of supporting members include at least a first supporting member that is closest to an intermediate position between the third portion and the fourth portion of the frame and a second supporting member that is located closer to the third portion of the frame than the first supporting member, and when the first surface of the frame is located above the second surface, the first supporting member warps downward from the frame with a first preliminary warping amount, and the second supporting member warps downward from the frame with a second preliminary warping amount that is smaller than the first preliminary warping amount.

According to a thirteenth aspect of the present disclosure, in the mask support mechanism of the twelfth aspect described above, the plurality of supporting members include a third supporting member that is located closer to the fourth portion of the frame than the first supporting member, and when the first surface of the frame is located above the second surface, the third supporting member may warp downward from the frame with a third preliminary warping amount that is smaller than the first preliminary warping amount.

According to a fourteenth aspect of the present disclosure, in the mask support mechanism of the thirteenth aspect described above, the plurality of supporting members include a fourth supporting member that is located closer to the third portion of the frame than the second supporting member and a fifth supporting member that is located closer to the fourth portion of the frame than the third supporting member, and when the first surface of the frame is located above the second surface, the fourth supporting member warps downward from the frame with a fourth preliminary warping amount that is smaller than the second preliminary warping amount, and the fifth supporting member warps downward from the frame with a fifth preliminary warping amount that is smaller than the third preliminary warping amount.

According to a fifteenth aspect of the present disclosure, in the mask support mechanism of each of the twelfth to fourteenth aspects described above, each of the supporting members may have a thickness of 50 μm or more.

According to a sixteenth aspect of the present disclosure, in the mask support mechanism of each of the twelfth to fifteenth aspects described above, each of the supporting members may have a thickness of 1 mm or less.

According to a seventeenth aspect of the present disclosure, in the mask support mechanism of each of the twelfth to sixteenth aspects described above, the frame has a third surface facing the opening, which is located between the first surface and the second surface, and the third surface of the first portion at a position where the first portion overlaps the first supporting member in plan view may be located closer to the second portion than the third surface of the first portion at a position where the first portion overlaps the second supporting member in plan view.

According to an eighteenth aspect of the present disclosure, in the mask support mechanism of each of the twelfth to seventeenth aspects described above, the first portion and the second portion of the frame may be shorter than the third portion and the fourth portion of the frame.

According to a nineteenth aspect of the present disclosure, in the mask support mechanism of each of the twelfth to eighteenth aspects described above, a ratio of a length of the third portion and the fourth portion to a length of the first portion and the second portion may be 1.1 or more.

A twentieth aspect of the present disclosure is a production method for a deposition mask apparatus which comprises:

a step of preparing a frame including a first portion, a second portion facing the first portion across an opening in a first direction, a third portion, and a fourth portion facing the third portion across the opening in a second direction different from the first direction, and including a first surface and a second surface that is located opposite to the first surface;

a step of fixing a first supporting member, in a state in which a first tension is applied to the first supporting member, to the first portion and the second portion of the frame on the first surface side of the frame such that the first supporting member is closest to an intermediate position between the third portion and the fourth portion of the frame;

a step of fixing a second supporting member, in a state in which a second tension larger than the first tension is applied to the second supporting member, to the first portion and the second portion of the frame on the first surface side of the frame at a position closer to the third portion of the frame than the first supporting member; and a step of fixing a deposition mask including a plurality of holes to the third portion and the fourth portion of the frame on the first surface side of the frame after fixing the first supporting member and the second supporting member to the frame.

Hereinafter, an embodiment of the present disclosure will be described in detail with reference to the drawings. The embodiment described below is an example of an embodiment of the present disclosure, and the present disclosure is not construed as being limited to only such an embodiment.

Firstly, a deposition apparatus 80 for performing a deposition process for depositing a deposition material on an object is explained with reference to FIG. 1. As shown in FIG. 1, the deposition apparatus 80 may include therein a deposition source 81, a heater 83, and a deposition mask apparatus 10. In addition, the deposition apparatus 80 may further include exhaust means to create a vacuum atmosphere inside of the deposition apparatus 80. An example of the deposition source 81 is a crucible that accommodates a deposition material 82 such as an organic luminescent material. The heater 83 is configured to heat the deposition source 81 to evaporate the deposition material 82 in the vacuum atmosphere. The deposition mask apparatus 10 is placed opposite to the deposition source 81.

Hereinafter, the deposition mask apparatus 10 is described. As shown in FIG. 1, the deposition mask apparatus 10 includes a frame 15 and a deposition mask 20 fixed to the frame 15. The frame 15 is configured to hold the deposition mask 20 in a taut state in the planar direction in order to restrain the deposition mask 20 from warping.

The deposition mask apparatus 10 is disposed in a deposition apparatus 80 such that the deposition mask 20 faces a substrate 91 as an object, onto which the deposition material 82 is to be deposited as shown in FIG. 1. The deposition mask 20 has a plurality of holes 25 through which the deposition material 82 incoming from the deposition source 81 passes. In the following description, a surface of the deposition mask 20 located on the side of the substrate 91 is referred to as "first surface 201", and a surface of the deposition mask 20 opposite to the first surface 201 is referred to as "second surface 202". The incoming deposition material 82 adheres to the substrate 91.

The deposition mask apparatus 10 may include a cooling plate 85 disposed on a surface of the substrate 91, which is opposite to the other surface of the substrate 91 facing the deposition mask 20, as shown in FIG. 1. The cooling plate 85 may have a flow path for circulating a refrigerant inside the cooling plate 85. The deposition mask apparatus 10 includes the cooling plate 85, which makes it possible to suppress an increase in the temperature of the substrate 91 during the vapor deposition step.

Although not shown, the deposition mask apparatus 10 may include a magnet disposed on the surface of the substrate 91, which is opposite to the other surface of the substrate 91 facing the deposition mask 20. The magnet may be arranged on a surface of the cooling plate 85, which is opposite to the other surface of the cooling plate 85 facing the deposition mask 20. By providing the magnet, the deposition mask can be attracted to the substrate 91 by magnetic force, and the deposition mask 20 can be brought into close contact with the substrate 91. Thus, it is possible to suppress the occurrence of shadow in the vapor deposition step thereby improving the dimensional accuracy and positional accuracy of a deposition layer formed on the substrate 91 with the deposition material 82 attached to the substrate 91. The term "shadow" used herein refers to a phenomenon in which the deposition material 82 enters a gap between the deposition mask 20 and the substrate 91, thereby causing the thickness of the deposition layer to be uneven. Alternatively, the deposition mask 20 may be brought into close contact with the substrate 91 by using an electrostatic chuck that utilizes electrostatic force.

Figure 2:
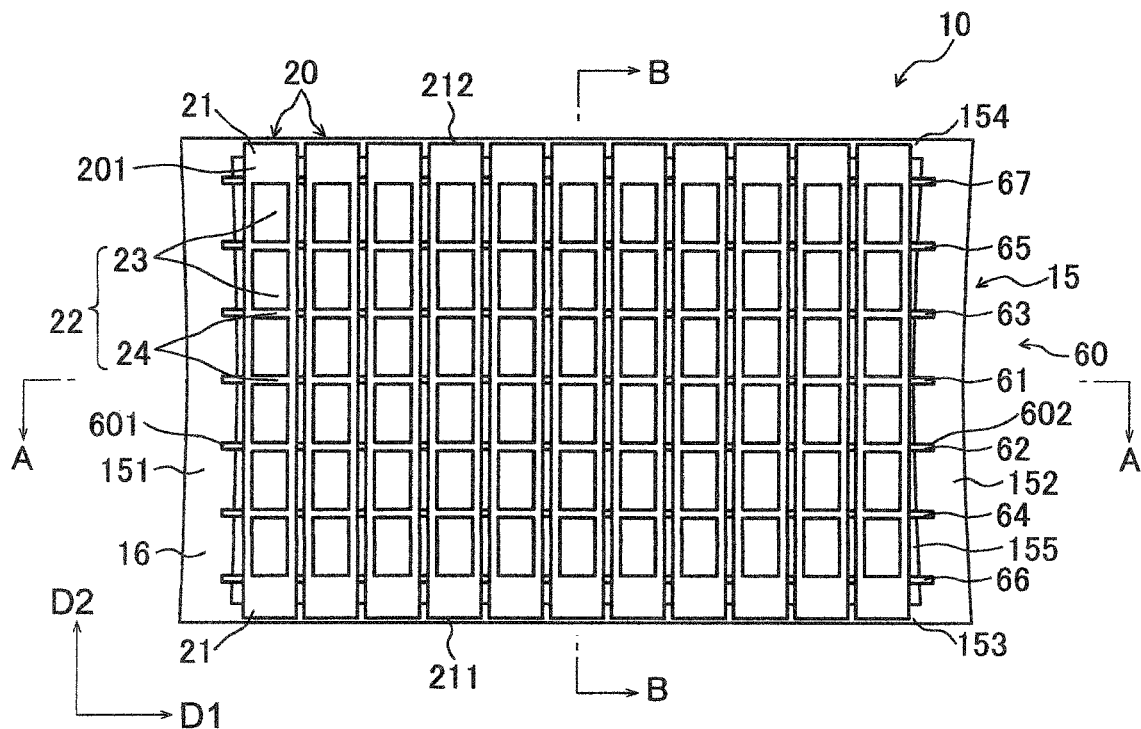
FIG. 2 is a plan view illustrating a deposition mask apparatus according to one embodiment of the disclosure.

FIG. 2 is a plan view of the deposition mask apparatus 10 when viewed from the first surface 201 side of the deposition mask 20. As shown in FIG. 2, the deposition mask apparatus 10 may include a plurality of deposition masks 20 arranged in a first direction D1. In this embodiment, each deposition mask 20 has a rectangular shape extending in a second direction D2 crossing the first direction D1. Each deposition mask 20 is fixed via both end portions in the longitudinal direction of the deposition mask 20 to the frame 15 by being welded, for example.

Figure 3:
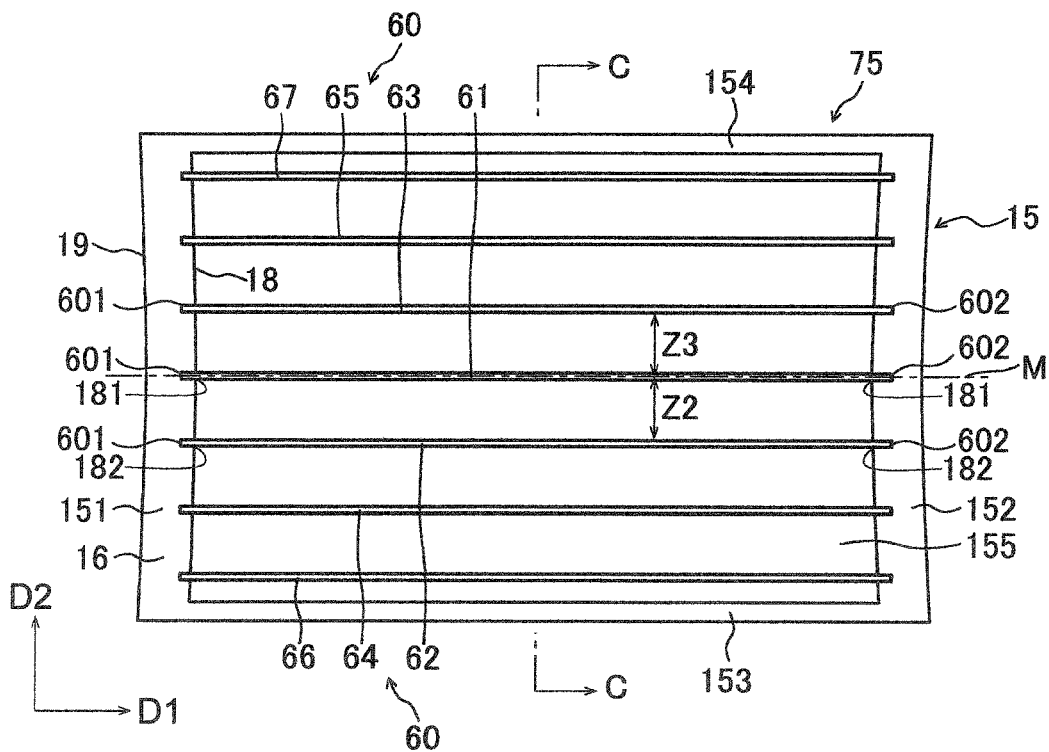
FIG. 3 is a plan view illustrating an assembled body including a frame and a supporter fixed to the frame.

As shown in FIG. 2, the deposition mask apparatus 10 may include a supporter 60 located between the frame 15 and the deposition mask 20. The supporter 60 may be fixed to the frame 15. FIG. 3 is a plan view showing a state in which the deposition mask 20 has been removed from the deposition mask apparatus 10 in FIG. 2 in order to clearly show the supporter 60. The component including the frame 15 and the supporter 60 may be also referred to as "mask support mechanism 75".

Hereinafter, the frame 15, the deposition mask 20, and the supporter 60 of the deposition mask apparatus 10 will be described in detail.

Firstly, the frame 15 will be described. As shown in FIGS. 2 and 3, the frame 15 has a frame member including a first portion 151, a second portion 152, a third portion 153, and a fourth portion 154, and an opening 155 inside the frame member. The first portion 151 and the second portion 152 face each other across the opening 155 in the first direction D1. The third portion 153 and the fourth portion 154 face each other across the opening 155 in a second direction D2 different from the first direction D1.

As shown in FIGS. 2 and 3, the first direction D1 and the second direction D2 may be orthogonal to each other. The first portion 151 and the second portion 152 may extend in the second direction D2. The third portion 153 and the fourth portion 154 may extend in the first direction D1.

As shown in FIGS. 2 and 3, the first portion 151 and the second portion 152 of the frame 15 may be shorter than the third portion 153 and the fourth portion 154. As shown in FIG. 2, on the first surface 16 side of the frame 15, the end portions of the supporter 60 may be fixed to the first portion 151 and the second portion 152. On the first surface 16 side of the frame 15, the end portions of the deposition mask 20 may be fixed to the third portion 153 and the fourth portion 154. In this case, as shown in FIG. 2, the supporter 60 is longer than the deposition mask 20.

The ratio of the length of the third portion 153 and the fourth portion 154 to the length of the first portion 151 and the second portion 152 may be, for example, 1.1 or more, 1.2 or more, or 1.3 or more. The ratio of the length of the third portion 153 and the fourth portion 154 to the length of the first portion 151 and the second portion 152 may be, for example, 1.5 or less, 1.7 or less, or 2.0 or less. The ratio of the length of the third portion 153 and the fourth portion 154 to the length of the first portion 151 and the second portion 152 may be in a range defined by a first group consisting of 1.1, 1.2, and 1.3 and/or a second group consisting of 1.5, 1.7, and 2.0. The ratio of the length of the third portion 153 and the fourth portion 154 to the length of the first portion 151 and the second portion 152 may be in a range determined by a combination of any one of the values included in the first group and any one of the values included in the second group. The ratio of the length of the third portion 153 and the fourth portion 154 to the length of the first portion 151 and the second portion 152 may be in a range determined by a combination of any two of the values included in the first group. The ratio of the length of the third portion 153 and the fourth portion 154 to the length of the first portion 151 and the second portion 152 may be in a range determined by a combination of any two of the values included in the second group. For example, the ratio may be 1.1 or more and 2.0 or less, 1.1 or more and 1.7 or less, 1.1 or more and 1.5 or less, 1.1 or more and 1.3 or less, 1.1 or more and 1.2 or less, 1.2 or more and 2.0 or less, 1.2 or more and 1.7 or less, 1.2 or more and 1.5 or less, 1.2 or more and 1.3 or less, 1.3 or more and 2.0 or less, 1.3 or more and 1.7 or less, 1.3 or more and 1.5 or less, 1.5 or more and 2.0 or less, 1.5 or more and 1.7 or less, or 1.7 or more and 2.0 or less.

As a material forming the frame 15, the same material as a material of a metal plate for the deposition mask 20 described later can be used. For example, an iron alloy containing nickel can be used.

Next, the deposition mask 20 will be described. As shown in FIG. 2, the deposition mask 20 may have a pair of end parts 21 fixed to the frame 15, and an intermediate part 22 located between the end parts 21. In the following description, one of the pair of end parts 21, which is fixed to the third portion 153 of the frame 15, is also referred to as "third end 211", and the other of the pair of end parts 21, which is fixed to the fourth portion 154 of the frame 15, is also referred to as "fourth end 212".

The intermediate part 22 of the deposition mask 20 may have at least one effective area 23 and a peripheral area 24 located around the effective area 23. In the example shown in FIG. 2, the intermediate part 22 includes a plurality of effective areas 23 arranged at predetermined intervals along the second direction D2. The peripheral area 24 surrounds a plurality of effective areas 23.

In a case in which a display device such as an organic EL display device is produced using the deposition mask 20, one effective area 23 corresponds to a display area of one organic EL display device. Therefore, the deposition mask apparatus 10 shown in FIG. 2 can form the deposition layer constituting the organic EL display devices on one substrate. A single effective area 23 may also correspond to a plurality of display areas. Although not shown, a plurality of effective areas 23 may be arranged at predetermined intervals in the width direction of the deposition mask 20.

Each effective area 23 has an outline of, for example, a substantially quadrangular shape in plan view, more precisely, a substantially rectangular shape in plan view. Although not shown, each effective area 23 can have an outline of a different shape in accordance with the shape of the display area of the organic EL display device. For example, each effective area 23 may have a circular outline. The plan view means that the deposition mask apparatus 10 is viewed along the normal direction of the first surface 16 of the frame 15.

Next, the supporter 60 will be described. As shown in FIGS. 2 and 3, the supporter 60 may include a plurality of supporting members arranged in the second direction D2. In the examples shown in FIGS. 2 and 3, the supporter 60 includes seven supporting members. Each supporting member may include an end portion fixed to the first portion 151 on the first surface 16 side of the frame 15 and an end portion fixed to the second portion 152 on the first surface 16 side of the frame 15. In the following description, the end portion of the supporting member fixed to the first portion 151 is also referred to as "first end 601", and the end portion of the supporting member fixed to the second portion 152 is also referred to as "second end 602".

The plurality of supporting members include at least a first supporting member 61 and a second supporting member 62. The first supporting member 61 is closest to an intermediate position between the third portion 153 and the fourth portion 154 of the frame 15. The second supporting member 62 is located closer to the third portion 153 than the first supporting member 61. The "intermediate position between the third portion 153 and the fourth portion 154" is a position where the distance to the third portion 153 and the distance to the fourth portion 154 in the second direction D2 are equal. In FIG. 3, an alternate long and short dash line denoted by a reference sign M indicates an intermediate position between the third portion 153 and the fourth portion 154. When there is a supporting member overlapping the intermediate position in plan view, the supporting member overlapping the intermediate position is the first supporting member 61 closest to the intermediate position. In the example shown in FIG. 3, the first supporting member 61 overlaps an intermediate position between the third portion 153 and the fourth portion 154. When there is not a supporting member overlapping the intermediate position in plan view, the supporting member having a minimum distance from the intermediate position is the first supporting member 61 closest to the intermediate position. In FIG. 3, a reference sign Z2 denotes a distance between the intermediate position and the second supporting member 62. A reference sign Z3 denotes a distance between the intermediate position and the third supporting member 63. The plurality of supporting members may further include a third supporting member 63 located closer to the fourth portion 154 than the first supporting member 61. Further, the plurality of supporting members may further include a fourth supporting member 64 located closer to the third portion 153 than the second supporting member 62. The plurality of supporting members may further include a fifth supporting member 65 located closer to the fourth portion 154 than the third supporting member 63. The plurality of supporting members may further include a sixth supporting member 66 located closer to the third portion 153 than the fourth supporting member 64. Further, the plurality of supporting members may further include a seventh supporting member 67 located closer to the fourth portion 154 than the fifth supporting member 65.

As shown in FIG. 2, the plurality of supporting members of the supporter 60 may overlap a peripheral area 24 of the deposition mask 20 in plan view. Thus, the deposition material that has passed through the holes in the effective area 23 of the deposition mask 20 can be restrained from adhering to the supporter 60.

As a material forming each supporting member of the supporter 60, the same material as a material of a metal plate for the deposition mask 20 described later can be used. For example, an iron alloy containing nickel can be used.

Figure 4:
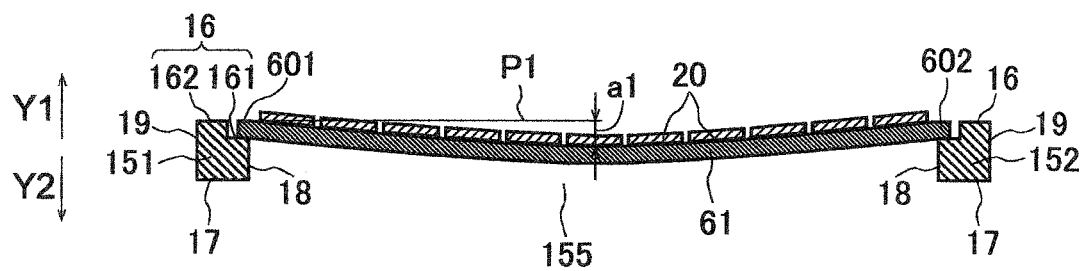
FIG. 4 is a sectional view along the A-A line of FIG. 2.
Figure 5:
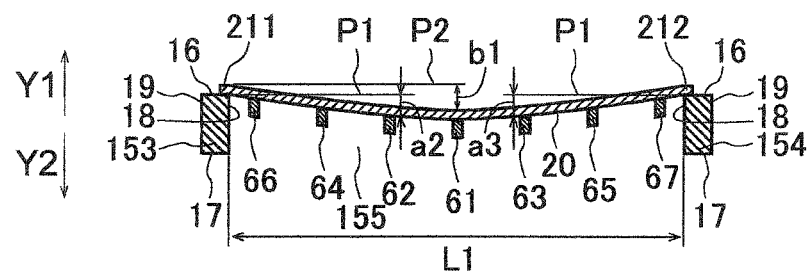
FIG. 5 is a sectional view along the B-B line of FIG. 2.

Next, a cross-sectional structure of the deposition mask apparatus 10 will be described with reference to FIGS. 4 and 5. FIG. 4 is a cross-sectional view taken along the line A-A of FIG. 2 passing through the first supporting member 61. FIG. 5 is a cross-sectional view taken along the line B-B of FIG. 2 through the deposition mask 20 at an intermediate position between the first portion 151 and the second portion 152.

As shown in FIGS. 4 and 5, the frame 15 includes a first surface 16, a second surface 17, a third surface 18, and a fourth surface 19. The first surface 16 is located on the side where the deposition mask 20 and the supporter 60 are fixed to the frame 15. The second surface 17 is located opposite side of the first surface 16. The third surface 18 is located between the first surface 16 and the second surface 17 and faces the opening 155. The fourth surface 19 is located on the opposite side of the third surface 18 in the horizontal direction.

As shown in FIG. 4, the first surface 16 may include a fifth surface 162 and a sixth surface 161 located closer to the second surface 17 than the fifth surface 162. The fifth surface 162 may be located on the same plane as the first surface 16 of the third portion 153 and the fourth portion 154 to which the deposition mask 20 is fixed. The sixth surface 161 may be connected to the third surface 18. Supporting members such as the first supporting member 61 may be fixed to the sixth surface 161. The sixth surface 161 may be formed by cutting a part of the fifth surface 162.

Supporting members such as the first supporting member 61 of the supporter 60 are located between the frame 15 and the deposition mask 20 on the first surface 16 side. Supporting members such as the first supporting member 61 function to support the deposition mask 20 that warps downward by its own weight from below. Note that supporting members such as the first supporting member 61 also warps downward due to its own weight and the force received from the deposition mask 20.

The downward warping amount of a supporting member when the first surface 16 of the frame 15 is located above the second surface 17 will be described. In the cross-sectional views such as FIGS. 4 and 5, an arrow Y1 represents an upper side and an arrow Y2 represents a lower side.

In FIG. 4, a reference sign a1 denotes the downward warping amount of the first supporting member 61. The warping amount is a vertical distance between a portion of the first supporting member 61 fixed to the frame 15 and a lowermost portion of the first supporting member 61. In the example illustrated in FIG. 4, a portion of the first supporting member 61 at an intermediate position between the first portion 151 and the second portion 152 is located at the lowest position. As a measuring instrument for measuring the warping amount, a laser displacement meter such as LK-G85 manufactured by KEYENCE CORPORATION can be used. In the following description, the warping amount of the first supporting member 61 is also referred to as "first warping amount a1". A horizontal plane passing through a portion of the first supporting member 61 fixed to the frame 15 is also referred to as "first reference plane P1".

As shown in FIG. 5, other supporting members such as the second supporting member 62 and the third supporting member 63 may warp downward. In FIG. 5, a reference sign a2 denotes a downward warping amount of the second supporting member 62, and a reference sign a3 denotes a downward warping amount of the third supporting member 63. In the following description, the warping amount of the second supporting member 62 is also referred to as "second warping amount a2", and the warping amount of the third supporting member 63 is also referred to as "third warping amount a3". Although not shown, regarding the supporting members subsequent to the fourth supporting member 64 the warping amount of the n-th supporting member is also referred to as "n-th warping amount", and is denoted by a reference sign "an". n is a natural number. The method for measuring the warping amount of each supporting member is the same as the method for measuring the first warping amount a1 of the first supporting member 61.

The plurality of supporting members of the supporter 60 are fixed to the frame 15 such that the supporting member located closer to the third portion 153 or the fourth portion 154 of the frame 15 has a smaller warping amount. For example, the second warping amount a2 of the second supporting member 62 and the third warping amount a3 of the third supporting member 63 are smaller than the first warping amount a1 of the first supporting member 61. The fourth warping amount a4 of the fourth supporting member 64 is smaller than the second warping amount a2 of the second supporting member 62. The fifth warping amount a5 of the fifth supporting member 65 is smaller than the third warping amount of deflection a3 of the third supporting member 63. The sixth warping amount a6 of the sixth supporting member 66 is smaller than the fourth warping amount a4 of the fourth supporting member 64. The seventh warping amount a7 of the seventh supporting member 67 is smaller than the fifth warping amount a5 of the fifth supporting member 65. Such a relationship is represented by the following relational expressions.

$$a1 > a2 > a4 > a6$$

$$a1 > a3 > a5 > a7$$

By adjusting the warping amounts of the plurality of supporting members of the supporter 60 as described above, the downward warping amount of the deposition mask 20 can be maximized at an intermediate position between the third portion 153 and the fourth portion 154 as shown in FIG. 5. In addition, the supporter 60 can support the deposition mask 20 such that the downward warping amount of the deposition mask 20 decreases from the intermediate position between the third portion 153 and the fourth portion 154 to the third portion 153 or the fourth portion 154.

In FIG. 5, a reference sign b1 denotes the downward warping amount of the deposition mask 20. As in the case of supporting members such as the first supporting member 61, the warping amount b1 of the deposition mask 20 corresponds to a vertical distance between the portion of the deposition mask 20 fixed to the frame 15 and the lowermost portion of the deposition mask 20. A horizontal plane passing through a portion of the deposition mask 20 fixed to the frame 15 is also referred to as "second reference plane P2".

In FIG. 5, a reference sign L1 denotes a distance between the third portion 153 and the fourth portion 154 of the frame 15. b1/L1 is preferably 0.00228 or less. b1/L1 may be 0.00171 or less, or may be 0.00114 or less. Accordingly, it is possible to reduce the generation of a gap between the deposition mask 20 and the substrate 91. b1/L1 is preferably 0.00008 or more. b1/L1 may be 0.00014 or more, and may be 0.00029 or more.

The range of b1/L1 may be determined based on a combination of any of a plurality of upper limit candidate values and any of a plurality of lower limit candidate values. For example, b1/L1 may be 0.00008 or more and 0.00228 or less, 0.00014 or more and 0.00171 or less, or 0.00029 or more and 0.00114 or less. In addition, the range of the b1/L1 may be determined based on a combination of any two of a plurality of upper limit candidate values. For example, b1/L1 may be 0.00171 or more and 0.00228 or less. The range of the b1/L1 may be determined based on a combination of any two of a plurality of lower limit candidate values. For example, b1/L1 may be 0.00008 or more and 0.00014 or less.

Figure 6:
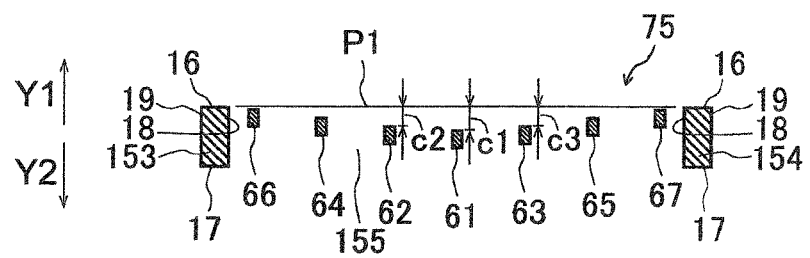
FIG. 6 is a sectional view along the C-C line of FIG. 3.

FIG. 6 is a sectional view along the C-C line of FIG. 3. As shown in FIG. 6, the supporter 60 in a state of not supporting the deposition mask 20 may also warp due to its weight. The warping amount in the n-th supporting member of the supporter 60 in a state of not supporting the deposition mask 20 is also referred to as "preliminary n-th warping amount", and is denoted by a reference sign "cn". "n" is a natural number. The method for measuring the preliminary warping amount of each supporting member is the same as the method for measuring the first warping amount a1 of the first supporting member 61. Regarding the preliminary warping amount cn, as in the case of the above-described warping amount an, the following relational expressions may be satisfied.

$$c1 > c2 > c4 > c6$$

$$c1 > c3 > c5 > c7$$

The thickness of each supporting member of the supporter 60 is determined to satisfy the above-described relationship of the warping amount. The thickness of each supporting member of the supporter 60 is preferably 50 μm or more. The thickness of each supporting member of the supporter 60 may be 60 μm or more, or 70 μm or more. Thus, it is possible to restrain the warping amount of each supporting member of the supporter 60 from becoming too large. In addition, the thickness of each supporting member of the supporter 60 is preferably 1 mm or less. The thickness of each supporting member of the supporter 60 may be 500 μm or less, or 200 μm or less. Thus, the deposition material that has passed through the holes in the effective area 23 of the deposition mask 20 can be restrained from adhering to the supporter 60. The thickness of each supporting member of the supporter 60 is, for example, 100 μm.

The range of thickness of each supporting member of the supporter 60 may be determined based on a combination of any of a plurality of upper limit candidate values and any of a plurality of lower limit candidate values. For example, the thickness of each supporting member of the supporter 60 may be 50 μm or more and 1 mm or less, 60 μm or more and 500 μm or less, or 70 μm or more and 200 μm or less. In addition, the range of the thickness of each supporting member of the supporter 60 may be determined based on a combination of any two of a plurality of upper limit candidate values. For example, the thickness of each supporting member of the supporter 60 may be 500 μm or more and 1 mm or less. The range of the thickness of each supporting member of the supporter 60 may be determined based on a combination of any two of a plurality of lower limit candidate values. For example, the thickness of each supporting member of the supporter 60 may be 50 μm or more and 60 μm or less. By setting the thickness of the supporting member to 1 mm or less, the number of steps required to cut the fifth surface 162 of the frame 15 to form the sixth surface 161 can be reduced.

A preferable range of thickness of each supporting member of the supporter 60 may be determined to be a relative value with respect to thickness of the deposition mask 20 at a position where the deposition mask overlaps the supporter 60 in plan view. The deposition mask 20 is supported by the supporter 60 from below at a position where the deposition mask overlaps the supporter 60 in plan view. Preferably, the thickness of each supporting member of the supporter 60 is larger than the thickness of the deposition mask 20 at a position where the deposition mask overlaps the supporter 60 in plan view. For example, the ratio of the thickness of each supporting member to the thickness of the deposition mask 20 is preferably 2 or more. The ratio may be 2.5 or higher, or 3 or higher. In addition, the ratio of the thickness of each supporting member to the thickness of the deposition mask 20 is preferably 50 or less. The ratio may be 40 or less, or 30 or less.

Further, the range of the thickness of each supporting member to the thickness of the deposition mask 20 may be determined based on a combination of any of the plurality of upper limit candidate values described above and any of the plurality of lower limit candidate values described above. For example, the ratio may be 2 or more and 50 or less, or 2.5 or more and 40 or less. In addition, the range of the ratio may be determined based on a combination of any two of a plurality of upper limit candidate values. For example, the ratio may be 40 or more and 50 or less. The range of the ratio may be determined based on a combination of any two of a plurality of lower limit candidate values. For example, the ratio may be 2 or more and 2.5 or less.

Figure 7:
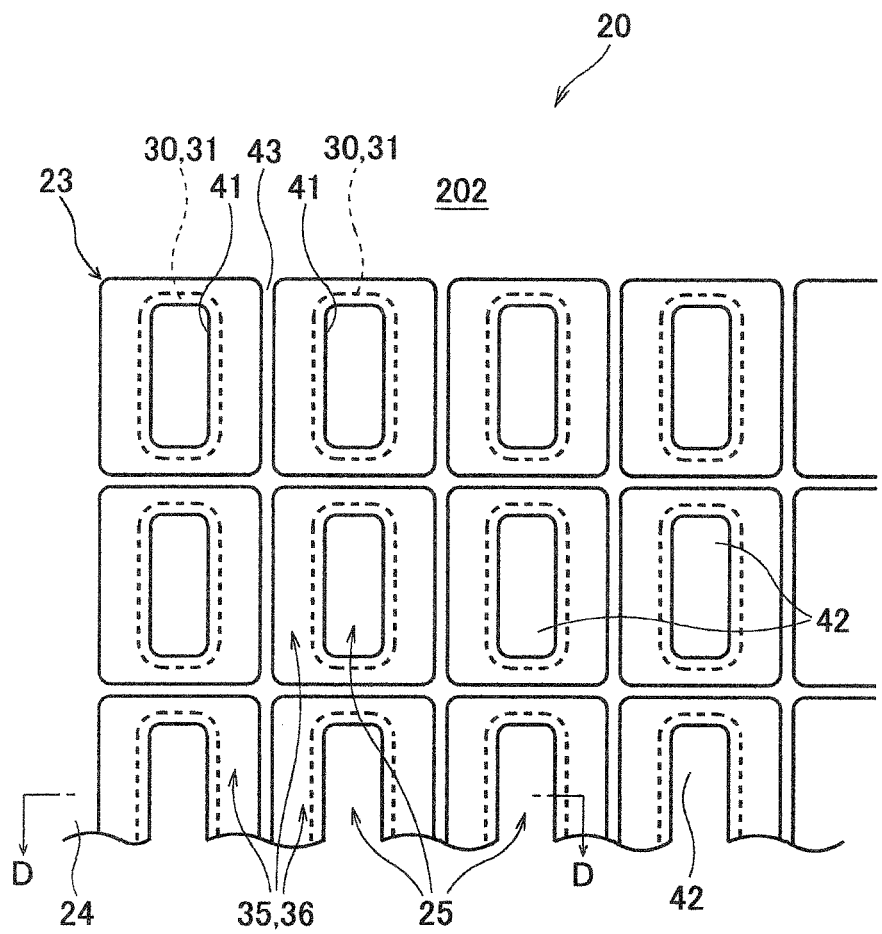
FIG. 7 is a partial plan view showing a part of the effective area of the deposition mask.

Next, an example of the structure of the deposition mask 20 will be described. FIG. 7 is a plan view showing the enlarged effective area 23 when viewed from the second surface 202 side of deposition mask 20. As shown in FIG. 7, a plurality of holes 25 formed in each effective area 23 are arranged at predetermined pitches along two directions perpendicular to each other.

Figure 8:
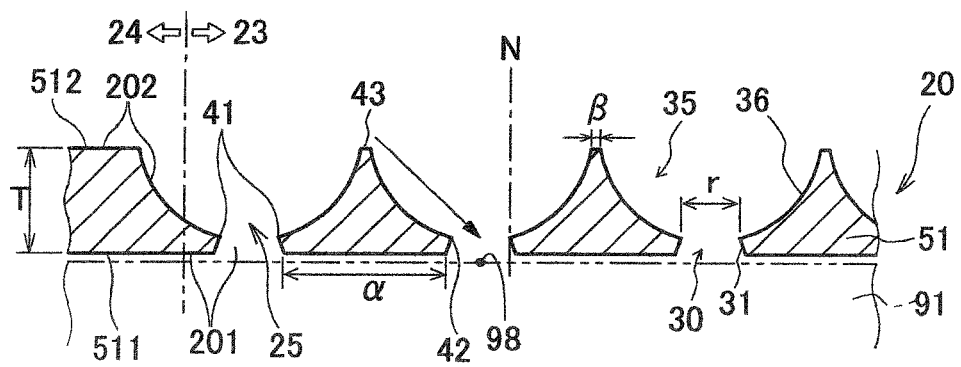
FIG. 8 is a sectional view along the D-D line of FIG. 7.

FIG. 8 is a sectional view along the D-D line of the effective area 23 of FIG. 7. As shown in FIG. 8, the plurality of holes 25 extend from the first surface 201 of the deposition mask 20 to the second surface 202. The holes 25 have a first recess 30 located on the first surface 511 of the metal plate 51 constituting the deposition mask 20 and a second recess 35 located on the second surface 512 on the opposite side of the first surface 511, which is connected to the first recess 30. The first recess 30 and the second recess 35 are formed by etching the metal plate 51 from the first surface 511 side and the second surface 512 side, respectively.

As shown in FIGS. 7 and 8, a wall surface 31 of the first recess 30 and a wall surface 36 of the second recess 35 may be connected via a circumferential connection portion 41. The connection portion 41 may define an passing portion 42 where an opening area of each hole 25 is minimum in plan view of the deposition mask 20.

As shown in FIG. 8, the adjacent two holes 25 on the first surface 201 side of the deposition mask 20 are spaced from each other on the first surface 511 of the metal plate 51. The adjacent two second recesses 35 may be also spaced from each other on the second surface 512 of the metal plate 51 on the second surface 202 side of the deposition mask 20. Namely, the second surface 512 of the metal plate 51 may remain between the two adjacent second recesses 35. In the description below, a portion of the effective area 23 of the second surface 512 of the meal plate 51, which is not etched and thus remains, is also referred to as "top portion 43". By producing the deposition mask 20 such that such a top portion 43 remains, the deposition mask 20 can have a sufficient strength. Thus, it can be restrained that the deposition mask 20 is damaged during transport, for example. In a case in which the width of the top portion 43 is too large, adhesion of a deposition material to a region overlapping the holes of the deposition mask 20 on a deposition object such as the substrate 91 is inhibited by the second surface 202 and/or the wall surface of the deposition mask 20. As a result, the utilization efficiency of the deposition material 82 may decrease. Thus, the deposition mask 20 is preferably produced such that the width 13 of the top portion 43 is excessively large.

In the vapor deposition step, the first surface 201 of the deposition mask 20 faces the substrate 91, and the second surface 202 of the deposition mask 20 is located toward a crucible 81 holding the deposition material 82. The deposition material 82 adheres to the substrate 91 through the second recess 35 whose opening area gradually decreases. As shown by the arrow in FIG. 8 extending from the second surface 202 toward the first surface 201, the deposition material 82 not only moves from the crucible 81 toward the substrate 91 along the normal direction N of the substrate 91, but also sometimes moves along a direction largely inclined with respect to the normal direction N of the substrate 91. At this time, when the thickness of the deposition mask 20 is large, the deposition material 82 moving diagonally tends to be stuck on the top portion 43, the wall surface 36 of the second recess 35, or the wall surface 31 of the first recess 30. As a result, the proportion of the deposition material 82 that cannot pass through the holes 25 increases. Thus, in order to improve a utilization efficiency of the deposition material 82, it is considered to be preferable that the thickness T of the deposition mask 20 is reduced so that heights of the wall surface 36 of the second recess 35 and the wall surface 31 of the first recess 30 are reduced. Namely, it can be said that it is preferable that a metal plate 51, which has the thickness T as small as possible as long as the strength of the deposition mask 20 is ensured, is used as the metal plate 51 for constituting the deposition mask 20. In consideration of this point, in the present embodiment, the thickness T of the deposition mask 20 is preferably 100 μm or less. The thickness T of the deposition mask 20 may be 50 μm or less, 40 μm or less, 35 μm or less, 30 μm or less, 25 μm or less, or 20 μm or less. Meanwhile, when the thickness of the deposition mask 20 is excessively small, strength of the deposition mask 20 is reduced, which is likely to cause damage or deformation of the deposition mask 20. In consideration of this point, the thickness T of the deposition mask 20 is preferably 5 μm or more. The thickness T of the deposition mask 20 may be 8 μm or more, 10 μm or more, 12 μm or more, 13 μm or more, or 15 μm or more.

The range of the thickness T of the deposition mask 20 may be determined based on a combination of any of the plurality of upper limit candidate values described above and any of the plurality of lower limit candidate values described above. For example, the thickness T of the deposition mask 20 may be in a range of 5 μm or more and 100 μm or less, 8 μm or more and 50 μm or less, 10 μm or more and 40 μm or less, 12 μm or more and 35 μm or less, 13 μm or more and 30 μm or less, 15 μm or more and 25 μm or less, or 15 μm or more and 20 μm or less. In addition, the range of the thickness T of the deposition mask 20 may be determined based on a combination of any two of the plurality of upper limit candidate values described above. For example, the thickness T of the deposition mask 20 may be in a range of 20 μm or more and 25 μm or less. In addition, the range of the thickness T of the deposition mask 20 may be determined based on a combination of any two of the plurality of lower limit candidate values described above. For example, the thickness T of the deposition mask 20 may be in a range of 13 μm or more and 15 μm or less.

The thickness T is a thickness of the peripheral area 24, i.e., a thickness of a part of the deposition mask 20 where the first recess 30 and the second recess 35 are not formed. Therefore, the thickness T can be said as a thickness of the metal plate 51.

As a method for measuring the thickness of the metal plate 51, the deposition mask 20, and the above-described supporter 60, a contact-type measurement method is employed. For a contact-type measuring method, "MT1271", a HEIDENHAIM-METRO length gauge manufactured by HEIDENHAIN and equipped with a guide ball bushing-type plunger is used.

In FIG. 8, the reference sign a represents a width of a portion (hereinafter also referred to as "rib portion") of the effective area 23 of the first surface 511 of the metal plate 51, which is not etched and thus remains. A width a of the rib portion and a size r of the passing portion 42 are suitably determined depending on a size of an organic EL display device and its display pixels.

Although not shown, etching may be performed such that two adjacent second recesses 35 are connected to each other. Namely, there may be a part where no second surface 512 of the metal plate 51 remains between two adjacent second recesses 35. Although not shown, etching may be performed such that two adjacent second recesses 35 are connected to each other over the entire second surface 512.

As a material of the metal plate 51, for example, an iron alloy containing nickel can be used. The iron alloy may further contain cobalt as well as nickel. For example, it is possible to use, as a material for the metal plate 51, an iron alloy containing nickel and cobalt at a total content of 30% or more and 54% or less by mass in which the cobalt content is 0% or more and 6% or less by mass. Concrete examples of an iron alloy containing nickel or nickel and cobalt may be an invar material containing nickel of 34% or more and 38% or less by mass, a super invar material containing cobalt in addition to nickel of 34% or more and 38% or less by mass, or a low thermal expansion Fe—Ni based plated alloy containing nickel of 38% or more and 54% or less by mass. By using such an iron alloy, the thermal expansion coefficient of the metal plate 51 can be reduced. For example, when a glass substrate is used as the substrate 91, the thermal expansion coefficient of the metal plate 51 can be set to a low value equal or proximate to that of the glass substrate. Accordingly, during the vapor deposition step, the dimensional accuracy and the positional accuracy of the deposition layer formed on the substrate 91 can be suppressed from being reduced due to the difference in thermal expansion coefficient between the deposition mask 20 including the metal plate 51 and the substrate 91.

Next, a method for manufacturing the deposition mask apparatus 10 described above will be described.

First, as shown in FIG. 3, a frame 15 provided with an opening 155 is prepared. The method for producing the frame 15 is appropriately determined. For example, the frame 15 can be manufactured by cutting a block of a material such as the above-described invar material forming the frame 15.

Next, as shown in FIG. 3, a supporter fixing step of fixing the first end 601 and the second end 602 of the plurality of supporting members of the supporter 60 to the first portion 151 and the second portion 152 of the frame 15 is performed. The first end 601 and the second end 602 are fixed by being welded, for example. At this time, as shown in FIG. 6, a plurality of supporting members may be fixed to the frame 15 so that the preliminary warping amount increases as a supporting member is positioned closer to the intermediate position between the third portion 153 and the fourth portion 154.

In the supporter fixing step, the supporter may be fixed to the frame 15 in order from the supporting member located near the intermediate position between the third portion 153 and the fourth portion 154. For example, first, the first supporting member 61 may be fixed to the frame 15, and then, the second supporting member 62 and the third supporting member 63 may be fixed to the frame 15. Thereafter, the fourth supporting member 64 and the 5th supporting member 65 may be fixed to the frame 15, and then the sixth supporting member 66 and the seventh supporting member 67 may be fixed to the frame 15.

Alternatively, in the supporter fixing step, the supporting members located far from the intermediate position between the third portion 153 and the fourth portion 154 may be fixed to the frame 15 in order. For example, first, the sixth supporting member 66 and the seventh supporting member 67 may be fixed to the frame 15, and then, the fourth supporting member 64 and the fifth supporting member 65 may be fixed to the frame 15. Thereafter, the second supporting member 62 and the third supporting member 63 may be fixed to the frame 15, and then the first supporting member 61 may be fixed to the frame 15.

When fixing the supporting members of the supporter 60 to the frame 15, a force may be applied to the frame 15 such that the first portion 151 and the second portion 152 are elastically deformed inward as shown in FIG. 3. By elastically deforming the first portion 151 and the second portion 152 inward, it is possible to apply a force due to restoring force of the first portion 151 and the second portion 152 to the supporting members of the supporter 60 fixed to the first portion 151 and the second portion 152. In this case, by adjusting the restoring force generated in the first portion 151 and the second portion 152, the preliminary warping amount of each supporting member of the supporter 60 can satisfy the above-described relational expression.

In a case in which a force is applied to the frame 15 such that the first portion 151 and the second portion 152 are elastically deformed inward, the third surface 18 of the first portion 151 at a position where the third surface overlaps the first supporting member 61 in plan view may be located closer to the second portion 152 than the third surface 18 of the first portion 151 at a position where the third surface overlaps the second supporting member 62 in plan view. In this case, a portion of the first portion 151 to which the first end 601 of the first supporting member 61 is welded may be located closer to the second portion 152 than a portion of the first portion 151 to which the first end 601 of the second supporting member 62 is welded. Such a positional relationship may occur when the length of the first supporting member 61 is the same as the length of the second supporting member 62.

The third surface 18 of the second portion 152 at a position where the second portion overlaps the first supporting member 61 in plan view may be located closer to the first portion 151 than the third surface 18 of the second portion 152 at a position where the second portion overlaps the second supporting member 62 in plan view. In this case, a portion of the first portion 152 to which the second end 602 of the first supporting member 61 is welded may be located closer to the first portion 151 than a portion of the second portion 152 to which the second end 602 of the second supporting member 62 is welded. Such a positional relationship may occur when the length of the first supporting member 61 is the same as the length of the second supporting member 62.

In FIG. 3, a third surface 18 of each of the first portion 151 and the second portion 152 at a position where each of the first portion 151 and the second portion 152 overlaps the first supporting member 61 in plan view is denoted by reference numeral 181. A third surface 18 of each of the first portion 151 and the second portion 152 at a position where each of the first portion 151 and the second portion 152 overlaps the second supporting member 62 in plan view is denoted by reference numeral 182.

Subsequently, as shown in FIG. 2, a mask fixing step of fixing the third end 211 and the fourth end 212 of the deposition mask 20 to the third portion 153 and the fourth portion 154 of the frame 15 is performed. The third end 211 and the fourth end 212 are fixed by being welded, for example. In the mask fixing step, the deposition mask 20 is fixed to the frame 15 while applying tension to the deposition mask 20 such that the holes 25 are appropriately arranged with respect to the substrate 91. Thus, a deposition mask apparatus 10 including the frame 15, the supporter 60, and the deposition mask 20 can be obtained.

In the mask fixing step, a force may be applied to the frame 15 such that the third portion 153 and the fourth portion 154 are elastically deformed inward. Thus, a force due to restoring force of the third portion 153 and the fourth portion 154 can be applied to the deposition mask 20 fixed to the third portion 153 and the fourth portion 154 thereby making it possible to restrain the deposition mask 20 from warping.

Here, when the force applied to the deposition mask 20 becomes too large, wrinkles may be generated in the deposition mask 20, and the positions of some holes 25 may deviate from the design. In this embodiment, the deposition mask apparatus 10 includes the supporter 60 that supports the deposition mask 20 from below. Thus, it is possible to reduce the occurrence of looseness in the deposition mask 20 while reducing the generation of wrinkles in the deposition mask 20.

Next, a deposition method for performing the vapor deposition of the deposition material 82 on the substrate 91 using the deposition mask apparatus 10 will be described. First, a step of combining the deposition mask apparatus 10 and the substrate 91 is performed. For examples, as shown by an arrow Q1 in FIG. 9A, the substrate 91 is relatively moved toward the deposition mask 20 of the deposition mask apparatus 10, and the substrate 91 is brought into contact with the deposition mask 20.

In this embodiment, the first supporting member 61, which is closest to the intermediate position of the third portion 153 and the fourth portion 154, supports the deposition mask 20 from below in a state of warping with a first warping amount a1. The second supporting member 62, which is located closer to the third portion 153 than the first supporting member 61, supports the deposition mask 20 from below in a state of warping with a second warping amount a2 smaller than a first warping amount a1. The third supporting member 63, which is located closer to the fourth portion 154 than the first supporting member 61, supports the deposition mask 20 from below in a state of warping with a third warping amount a3 smaller than a first warping amount a1. In addition, the other supporting members also support the deposition mask 20 from below in a state where the tension of the supporting members is adjusted such that the warping amount decreases as the distance from the first supporting member 61 to the third portion 153 side or the fourth portion 154 side decreases. Therefore, the downward warping amount of the deposition mask 20 can be maximized at an intermediate position between the third portion 153 and the fourth portion 154 as shown in FIG. 5. In addition, the downward warping amount of the deposition mask 20 can be decreased from the intermediate position between the third portion 153 and the fourth portion 154 to the third portion 153 or the fourth portion 154.

As described above, by monotonously changing the warping amount of the deposition mask 20, it is possible to causing a contact between the substrate 91 and the deposition mask 20 in order in the second direction D2 when bringing the substrate 91 into contact with the deposition mask 20. For example, it is possible to first cause a contact between the substrate 91 and the deposition mask 20 at the intermediate position between the third portion 153 and the fourth portion 154, and then, change a contact position in order from the intermediate position toward the third portion 153 and from the intermediate position toward the fourth portion 154. Alternatively, it is possible to first cause a contact between the substrate 91 and the deposition mask 20 near the third portion 153 and the fourth portion 154, and then, change a contact position in order toward the intermediate position between the third portion 153 and the fourth portion 154. As described above, by causing a contact between the substrate 91 and the deposition mask 20 in order in the second direction D2, it is possible to reduce the generation of a gap between the substrate 91 and the deposition mask 20 as compared with a case in which a contact is made simultaneously at a plurality of positions on the second direction D2.

Preferably, the warping amount dl of the substrate 91 is larger than the warping amount b1 of the deposition mask 20. In other words, it is preferable to adjust the tension applied to each supporting member of the supporter 60 such that the warping amount b1 of the deposition mask 20 is smaller than the warping amount dl of the substrate 91.

Thus, it is possible to first cause a contact between the substrate 91 and the deposition mask 20 at the intermediate position between the third portion 153 and the fourth portion 154, and then, change a contact position in order from the intermediate position toward the third portion 153 and from the intermediate position toward the fourth portion 154.

Figure 9A:
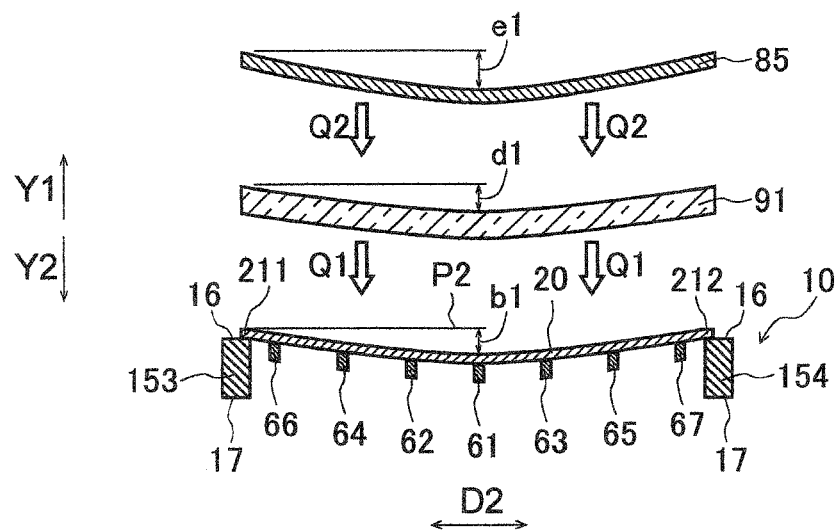
FIG. 9A is a schematic view for generally explaining an example of the production method for a deposition mask.

Then, as shown by arrow Q2 in FIG. 9A, a step of relatively moving the cooling plate 85 toward the substrate 91 so as to bring the cooling plate 85 into contact with the substrate 91 may be performed. The warping amount e1 of the cooling plate 85 is larger than the warping amount b1 of the deposition mask 20. The warping amount e1 of the cooling plate 85 may be larger than the warping amount dl' of the substrate 91. The warping amount dl' means the warping amount of the substrate 91 in a state of being in contact with the deposition mask 20. By making the warping amount e1 of the cooling plate 85 larger than the warping amount dl' of the substrate 91, it is possible to first cause a contact between the substrate 85 and the substrate 91 at the intermediate position between the third portion 153 and the fourth portion 154, and then, change a contact position in order from the intermediate position toward the third portion 153 and from the intermediate position toward the fourth portion 154.

Figure 9B:
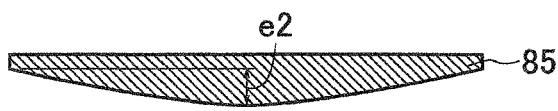
FIG. 9B is a view illustrating a modified example of a cooling plate.

The cooling plate 85 may have a curved surface that forms a protrusion toward the substrate 91 as shown in FIG. 9B. In this case, the protrusion amount e2 of the surface of the cooling plate 85 with respect to the surface of the substrate 91 is larger than the warping amount b1 of the deposition mask 20. The protrusion amount e2 may be larger than the warping amount dl of the substrate 91. Thus, even in a case in which the cooling plate 85 does not warp or slightly warps, it is possible to first cause a contact between the cooling plate 85 and the substrate 91 at the intermediate position between the third portion 153 and the fourth portion 154, and then, change a contact position in order from the intermediate position toward the third portion 153 and from the intermediate position toward the fourth portion 154.

Thereafter, although not shown, a magnet may be disposed on the surface of the cooling plate 85, which is opposite to the other surface of the cooling plate 85 facing the deposition mask 20. Accordingly, the deposition mask can be attracted toward the substrate 91 by the magnetic force.

Figure 10:
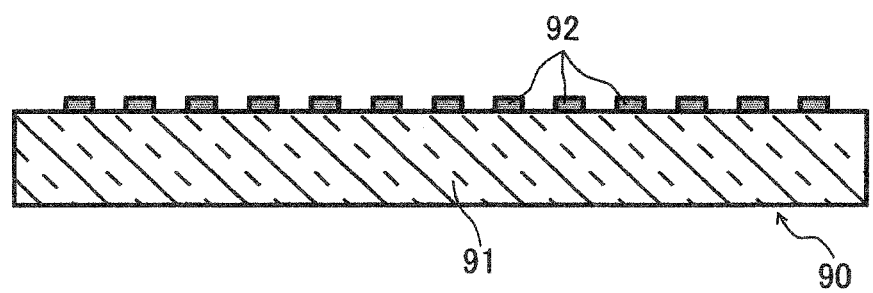
FIG. 10 is a sectional view of a deposition substrate produced using the deposition mask apparatus.

Next, the deposition material 82 is evaporated to fly to the substrate 91. It is possible for the deposition material 82 to adhere to the substrate 91 in a pattern corresponding to the holes 25 of the deposition mask 20. FIG. 10 is a cross-sectional view showing a deposition substrate 90 including a substrate 91 and a deposition layer 92 made of a deposition material 82 adhering to the substrate 91. Although not shown, the deposition substrate 90 may further include an electrode that overlaps the deposition layer 92.

According to this embodiment, it is possible to reduce the generation of a gap between the deposition mask 20 and the substrate 91. Therefore, it is possible to restrain the deposition material 82 from adhering to the substrate 91 in the gap between the deposition mask 20 and the substrate 91, thereby improving and the dimensional accuracy and position accuracy of the deposition layer 92. Accordingly, it is possible to reduce a margin provided in the design of the deposition substrate 90 in consideration of interference between adjacent pixels.

By reducing a margin in the design of the deposition substrate 90 in consideration of interference between adjacent pixels, it is possible to increase the pixel density of the deposition substrate 90. In a case in which the pixel density in the deposition substrate 90 is constant, the area of the electrode can be increased while restraining interference between adjacent pixels by reducing the margin. Thus, the luminance of the deposition layer 92 can be increased. The drive voltage required to obtain a certain luminance can also be reduced. This makes it possible to extend the life of an organic EL display device and reduce power consumption.

The aforementioned embodiment can be variously modified. Hereinafter, modification examples are described with reference to the drawings according to need. In the below description and the drawings used in the below description, a part that can be similarly constituted to the above embodiment has the same reference sign as that of corresponding part the above embodiment, and overlapped description is omitted. In addition, when the effect obtained by the aforementioned embodiment is apparently obtained in the modification examples, description thereof is possibly omitted.

In the above-described embodiment, an example in which one of the supporting members of the frame 15 is located at the intermediate position between the third portion 153 and the fourth portion 154 of the frame 15 and this supporting member is referred to as "first supporting member 61" is shown. In this modified example, as shown in FIG. 11, an example in which the supporting member is not located at the intermediate position between the third portion 153 and the fourth portion 154 of the frame 15 will be described.

Figure 11:
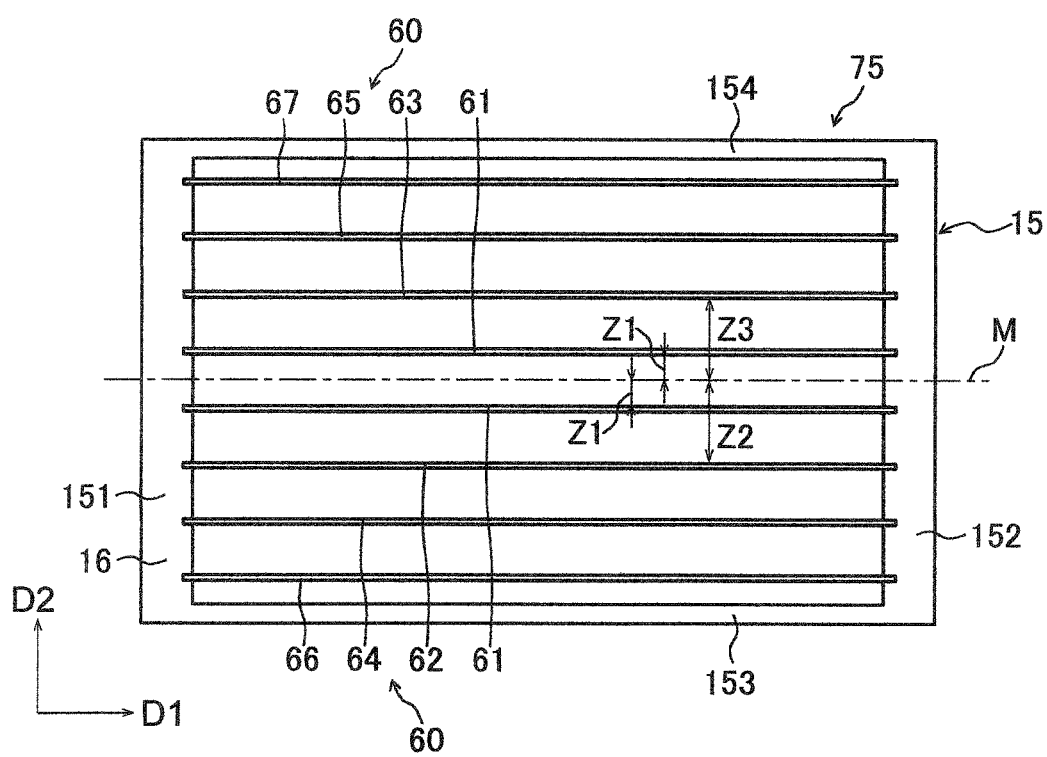
FIG. 11 is a plan view illustrating a modified example of the assembled body including a frame and a supporter fixed to the frame.

In FIG. 11, an alternate long and short dash line M indicating the intermediate position between the third portion 153 and the fourth portion 154 of the frame 15 does not overlap the supporting member. In this case, a pair of supporting members facing each other in the second direction D2 across the straight line M may be referred to as "first supporting member 61". In such a case, the warping amount of the two first supporting members 61 is determined to be the above-described first warping amount a1. The warping amount of two first supporting members 61 may be the same or different.

In FIG. 11, a reference sign Z1 denotes a distance between the intermediate position and the first supporting member 61. A reference sign Z2 denotes a distance between the intermediate position and the second supporting member 62. A reference sign Z3 denotes a distance between the intermediate position and the third supporting member 63. The distance Z1 is smaller than both the distance Z2 and the distance Z3.

In this modified example, the second warping amount a2 of the second supporting member 62 located closer to the third portion 153 than the first supporting member 61 is also larger than the first warping amount a1 of the first supporting member 61. The third warping amount a3 of the third supporting member 63 located closer to the fourth portion 154 than first supporting member 61 is also larger than the first warping amount a1 of the first supporting member 61. Accordingly, the downward warping amount of the deposition mask 20 can be maximized at an intermediate position between the third portion 153 and the fourth portion 154.

Figure 12:
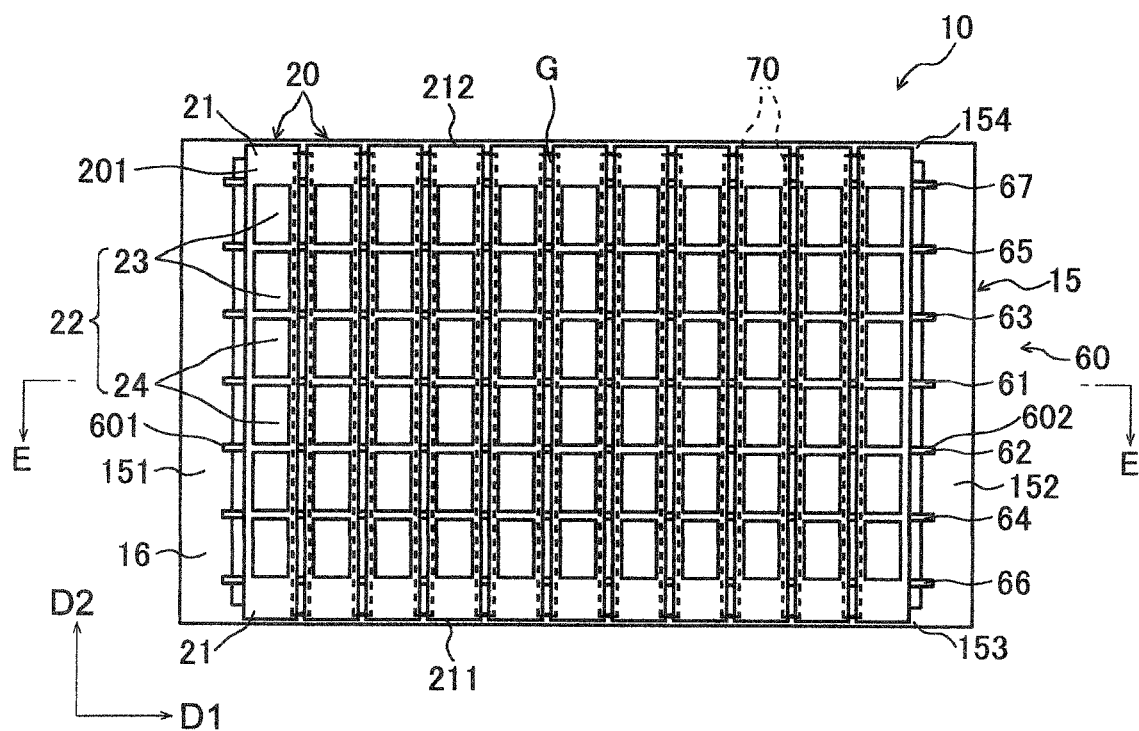
FIG. 12 is a plan view illustrating a modified example of the deposition mask apparatus.
Figure 13:
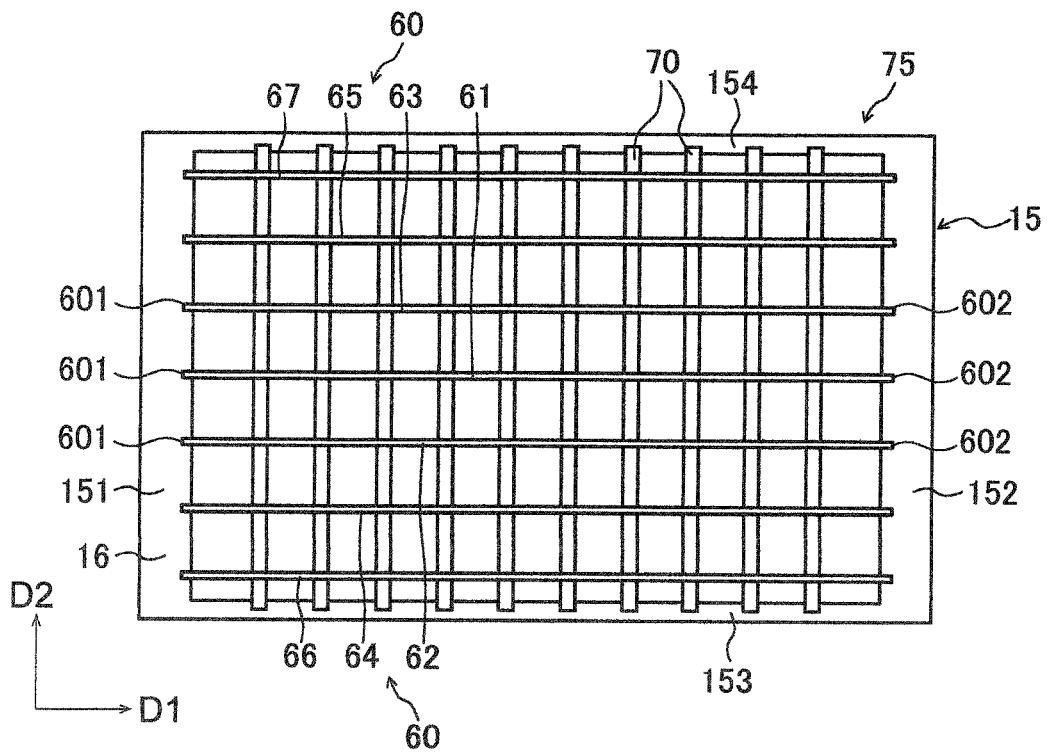
FIG. 13 is a plan view illustrating a modified example of the assembled body including a frame and a supporter fixed to the frame.

FIG. 12 is a plan view illustrating another modified example of the deposition mask apparatus 10. FIG. 13 is a plan view showing a state in which the deposition mask 20 has been removed from the deposition mask apparatus 10 in FIG. 12 in order to clearly show the covering member 70. As shown in FIGS. 12 and 13, the deposition mask apparatus 10 may further include a plurality of covering members 70 extending in the second direction D2 which are fixed to the third portion 153 and the fourth portion 154 of the frame 15.

Figure 14:
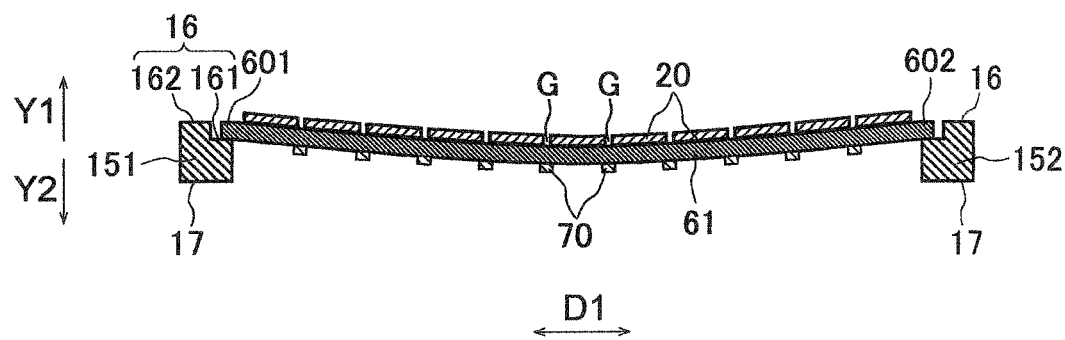
FIG. 14 is a sectional view along the E-E line of FIG. 12.

FIG. 14 is a cross-sectional view taken along the line E-E of FIG. 12 passing through the first supporting member 61. As shown in FIG. 14, the covering members 70 may be located closer to the second surface 17 of the frame 15 than the deposition mask 20 and the supporter 60. In addition, as shown in FIGS. 12 and 14, the covering members 70 may be located such that each covering member 70 overlaps a gap G between each two deposition masks 20 arranged in the first direction D1 when viewed along the normal direction of the surface of the deposition masks 20. Thus, the deposition material 82 can be restrained from passing through the gap G between the plurality of deposition masks 20 and adhering to the substrate 91 in the vapor deposition step.

Figure 15:
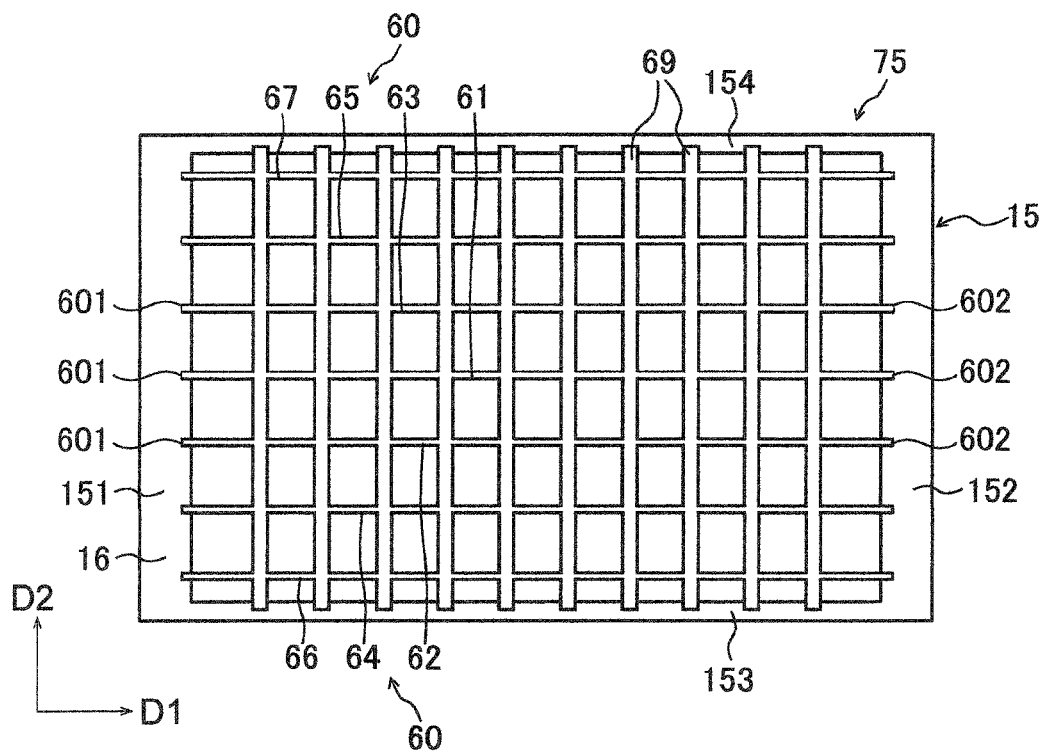
FIG. 15 is a plan view illustrating a modified example of the assembled body including a frame and a supporter fixed to the frame.

FIG. 15 is a plan view illustrating another modified example of the supporter 60 fixed to the frame 15. The supporter 60 may further include a plurality of covering members 69 extending in the second direction D2 which are arranged in the first direction D1, as well as a plurality of supporting members 61 to 67 extending in the first direction D1 which are arranged in the second direction D2. The plurality of supporting members 61 to 67 and the plurality of covering members 69 may be integrally formed with the same material. The covering members 69 can function as with the above-described covering members 70 such that the deposition material 82 can be restrained from passing through each gap G between each two deposition masks 20 and adhering to the substrate 91 in the vapor deposition step.

Figure 16:
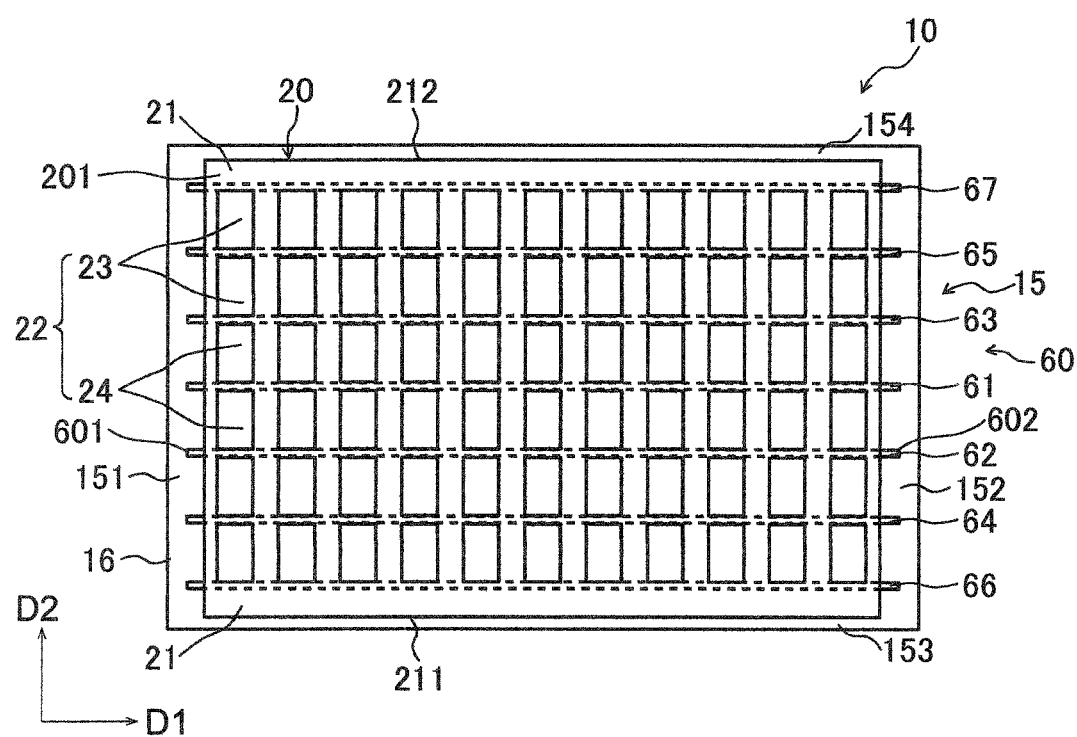
FIG. 16 is a plan view illustrating a modified example of the deposition mask apparatus.

FIG. 16 is a plan view illustrating another modified example of the deposition mask apparatus 10. As shown in FIG. 16, a plurality of effective areas 23 may be arranged not only in the second direction D2 but also in the first direction D1 on the deposition mask 20.

Next, with reference to FIGS. 2, 18, and 19, an example of a method for measuring the preliminary warping amount of the supporting members that do not support the deposition mask 20 will be described.

First, as shown in FIG. 2, a deposition mask apparatus 10 including a frame 15, a supporter 60, and a deposition mask 20 fixed to frame 15 is prepared. Next, as shown in FIG. 18, the deposition mask 20 located at a position where it overlaps the supporter 60 in plan view is removed. For example, the deposition mask 20 is cut at a position between a sixth supporting member 66 and a third portion 153, and the deposition mask 20 is also cut at a position between a seventh supporting member 67 and a fourth portion 154. Thus, a mask support mechanism 75 including the frame 15 and the supporter 60 in a state of not supporting the deposition mask 20 can be obtained.

Figure 18:
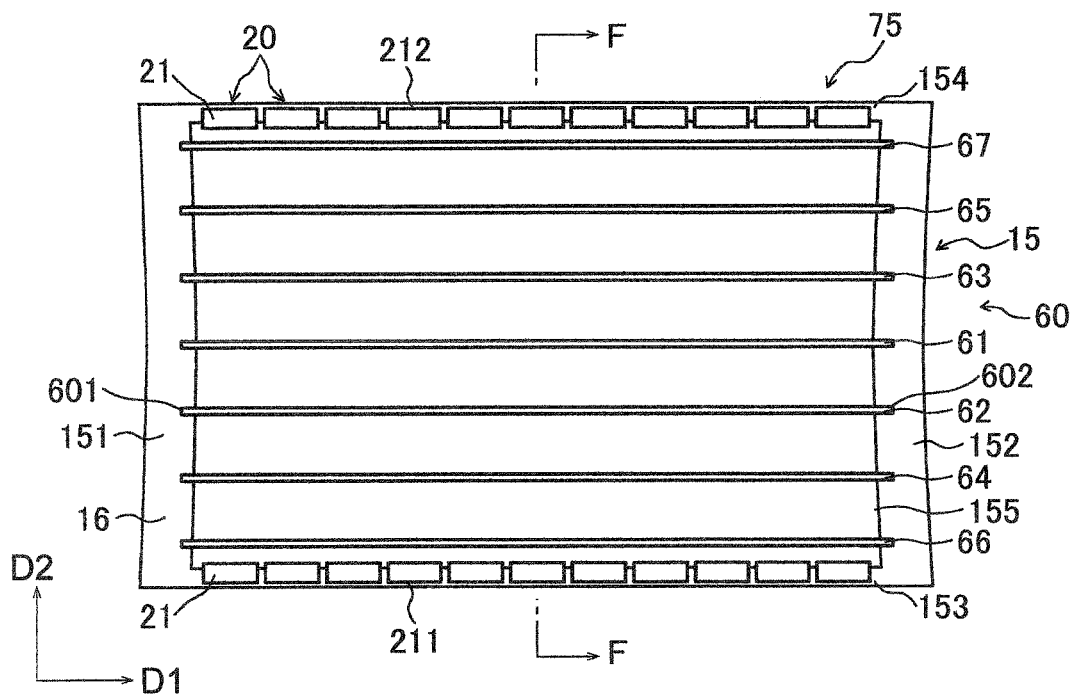
FIG. 18 is a plan view explaining an example of a method for measuring the preliminary warping amount of a supporting member of a mask support mechanism.
Figure 19:
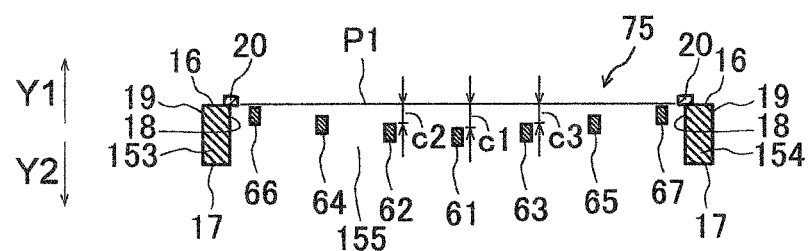
FIG. 19 is a sectional view along the F-F line of FIG. 18.

FIG. 19 is a sectional view along the F-F line of FIG. 18. In the mask support mechanism 75, a supporting member located closer to the third portion 153 or the fourth portion 154 of the frame 15 may have a smaller preliminary warping amount. For example, the second preliminary warping amount c2 of the second supporting member 62 and the third preliminary warping amount c3 of the third supporting member 63 are smaller than the first preliminary warping amount c1 of the first supporting member 61. The fourth preliminary warping amount c4 of the fourth supporting member 64 is smaller than the second preliminary warping amount c2 of the second supporting member 62. The fifth preliminary warping amount c5 of the fifth supporting member 65 is smaller than the third preliminary warping amount of deflection c3 of the third supporting member 63. The sixth preliminary warping amount c6 of the sixth supporting member 66 is smaller than the fourth preliminary warping amount c4 of the fourth supporting member 64. The seventh preliminary warping amount c7 of the seventh supporting member 67 is smaller than the fifth preliminary warping amount c5 of the fifth supporting member 65. As a measuring instrument for measuring the preliminary warping amount, a laser displacement meter such as LK-G85 manufactured by KEYENCE CORPORATION can be used.

Although some modified examples of the above-described embodiment have been described, it is needless to say that a plurality of modified examples may be appropriately combined and applied.

EXAMPLES

Next, the embodiment of the disclosure is described in more detail based on examples, and the embodiment of the disclosure is not limited to the below description of the examples unless the present invention departs from its thought.

Example 1

First, as in the case of the example shown in FIG. 3, a frame 15 including a first portion 151, a second portion 152, a third portion 153, and a fourth portion 154 was prepared. The distance between the first portion 151 and the second portion 152 was 1461 mm, and the distance between the third portion 153 and the fourth portion 154 was 877 mm.

Subsequently, while applying tension to seven supporting members 61 to 67, a first end 601 and a second end 602 of each of the supporting members 61 to 67 were fixed to the first portion 151 and the second portion 152, respectively, by being welded. Each of the supporting members 61 to 67 had a thickness of 100 μm and a width of 5.5 mm.

Subsequently, in a state where a first surface 16 of the frame 15 was located above a second surface 17, the preliminary warping amounts of the supporting members 61 to 67 were measured using a laser displacement meter LK-G85 manufactured by KEYENCE CORPORATION. The results are shown below.

first preliminary warping amount of first supporting member 61: 233 μm second preliminary warping amount of second supporting member 62: 174 μm third preliminary warping amount of third supporting member 63: 203 μm fourth preliminary warping amount of fourth supporting member 64: 117 μm fifth preliminary warping amount of fifth supporting member 65: 155 μm sixth preliminary warping amount of sixth supporting member 66: 73 μm seventh preliminary warping amount of seventh supporting member 67: 66 μm Subsequently, while applying tension to a deposition mask 20, a third end 211 and a fourth end 212 of the deposition mask 20 were fixed to the third portion 153 and the fourth portion 154, respectively, by being welded. The number of deposition masks 20 fixed to the frame 15 was 19. Each deposition mask 20 had a thickness of 30 μm and a width of 71.63 mm. The nineteen deposition masks 20 arranged from the first portion 151 side to the second portion 152 side are also referred to as "first deposition mask", "second deposition mask", . . . and "19th deposition mask" respectively.

Subsequently, in a state where the first surface 16 of the frame 15 was located above the second surface 17, the warping amounts of the 10th deposition mask at positions where the 10th deposition mask overlapped the supporting members 61 to 67 were measured using a laser displacement meter LK-G85 manufactured by KEYENCE CORPORATION. Namely, the warping amounts of the supporting members 61 to 67 were measured. The results are shown below. In this Example, the position of the upper surface of the portion of the supporting members 61 to 67 fixed to the frame 15 is equal to the position of the upper surface of the frame 15. In addition, each deposition mask is fixed on the upper surface of the frame 15. Further, the 10th deposition mask is located at an intermediate position between the first portion 151 and the second portion 152 of the frame 15. Therefore, the warping amounts of the 10th deposition mask at positions where the 10th deposition mask overlaps the supporting members 61 to 67 are equal to the warping amounts a1 to a7 of the supporting members 61 to 67. The warping amounts of the supporting members 61 to 67 calculated based on the warping amounts of the 10th deposition mask are as follows.

first warping amount of first supporting member 61: 420 μm second warping amount of second supporting member 62: 365 μm third warping amount of third supporting member 63: 377 μm fourth warping amount of fourth supporting member 64: 277 μm fifth warping amount of fifth supporting member 65: 285 μm sixth warping amount of sixth supporting member 66: 83 μm seventh warping amount of seventh supporting member 67: 72 μm In addition, in a state where the first surface 16 of the frame 15 was located above the second surface 17, the warping amounts of the first to 19th deposition masks in a state of being supported by the supporting member 61 to 67 were measured using a laser displacement meter LK-G85 manufactured by KEYENCE CORPORATION. The results are shown below.

Figure 17:
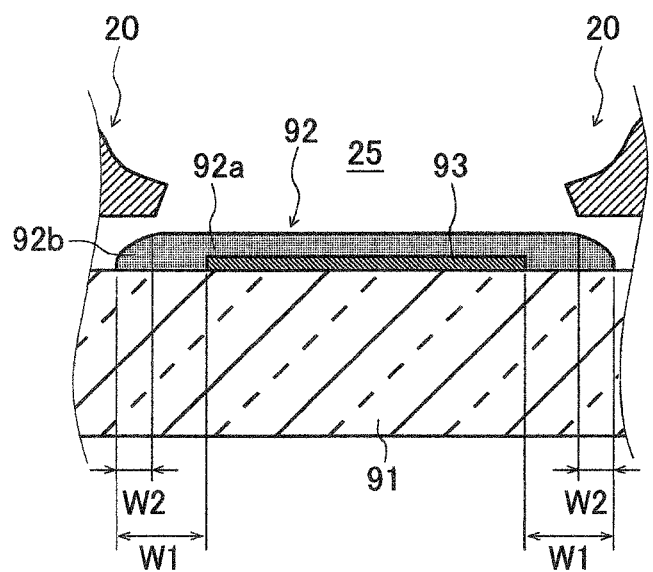
FIG. 17 is a view explaining a method for evaluating the dimensional accuracy and positional accuracy of a deposited layer.

Warping amount of first deposition mask: 144 μm
Warping amount of second deposition mask: 176 μm
Warping amount of third deposition mask: 261 μm
Warping amount of fourth deposition mask: 334 μm
Warping amount of fifth deposition mask: 336 μm
Warping amount of sixth deposition mask: 366 μm
Warping amount of seventh deposition mask: 374 μm
Warping amount of eighth deposition mask: 425 μm
Warping amount of ninth deposition mask: 412 μm
Warping amount of 10th deposition mask: 420 μm
Warping amount of 11th deposition mask: 404 μm
Warping amount of 12th deposition mask: 404 μm
Warping amount of 13th deposition mask: 370 μm
Warping amount of 14th deposition mask: 382 μm
Warping amount of 15th deposition mask: 365 μm
Warping amount of 16th deposition mask: 292 μm
Warping amount of 17th deposition mask: 320 μm
Warping amount of 18th deposition mask: 234 μm
Warping amount of 19th deposition mask: 138 μm Subsequently, the substrate 91 was brought into contact with the first to 19th deposition masks to perform the vapor deposition step. FIG. 17 shows a deposition layer 92 formed on an electrode 93 on the substrate 91. The deposition layer 92 includes a uniform thickness portion 92a and a shadow portion 92b. The uniform thickness portion 92a is a portion of the deposition layer 92 which has a thickness within a range of ±0.5% of the average thickness of the deposition layer 92. The shadow portion 92b is a portion having a thickness smaller than the average thickness of the deposition layer 92 by 0.5% or more. The average thickness of the deposition layer 92 is an average value of the thickness of a portion of the deposition layer 92 which overlaps the electrode 93. Thereafter, the dimensional accuracy and positional accuracy of the deposition layer 92 were evaluated. Specifically, for each of the deposition layers 92 formed using the first to 19th deposition masks, a distance W1 between the position of the end portion of the electrode 93 and the position of the end portion of the uniform thickness portion 92a of the deposition layer 92 was measured. In addition, it was determined whether the maximum value of the distance W1 in each deposition layer 92 was equal to or less than the first threshold. The first threshold is, for example, 5.6 μm. As a result, the maximum value of the distance W1 was equal to or less than the first threshold. In addition, a width W2 of the shadow portion 92b was measured for each of the deposition layers 92 formed using the first to 19th deposition masks. Further, it was determined whether the width W2 of the shadow portion 92b was less than or equal to the second threshold. The second threshold is, for example, 1.0 μm. As a result, the width W2 of the shadow portion 92b was equal to or smaller than the second threshold.

Comparative Example 1

A first end 601 and a second end 602 of each of the supporting members 61 to 67 were fixed to the first portion 151 and the second portion 152 of the frame 15, respectively, by being welded such that the preliminary warping amounts of the support members 61 to 67 became equal. Subsequently, as in the case of Example 1, the preliminary warping amounts of the supporting members 61 to 67 were measured. The results are shown below.

first warping amount of first supporting member 61: 68 μm second warping amount of second supporting member 62: 59 μm third warping amount of third supporting member 63: 63 μm fourth warping amount of fourth supporting member 64: 63 μm fifth warping amount of fifth supporting member 65: 62 μm sixth warping amount of sixth supporting member 66: 61 μm seventh warping amount of seventh supporting member 67: 58 μm Subsequently, as in the case of Example 1, while applying tension to the deposition mask 20, a third end 211 and a fourth end 212 of the deposition mask 20 were fixed to the third portion 153 and the fourth portion 154, respectively, by being welded. Next, the warping amounts of the first to 19th deposition masks in a state of being supported by the supporting member 61 to 67 were measured. The results are shown below.

Warping amount of first deposition mask: 59 μm
Warping amount of second deposition mask: 62 μm
Warping amount of third deposition mask: 62 μm
Warping amount of fourth deposition mask: 65 μm
Warping amount of fifth deposition mask: 64 μm
Warping amount of sixth deposition mask: 61 μm
Warping amount of seventh deposition mask: 66 μm
Warping amount of eighth deposition mask: 64 μm
Warping amount of ninth deposition mask: 65 μm
Warping amount of 10th deposition mask: 69 μm
Warping amount of 11th deposition mask: 69 μm
Warping amount of 12th deposition mask: 66 μm
Warping amount of 13th deposition mask: 62 μm
Warping amount of 14th deposition mask: 61 μm
Warping amount of 15th deposition mask: 60 μm
Warping amount of 16th deposition mask: 57 μm
Warping amount of 17th deposition mask: 63 μm
Warping amount of 18th deposition mask: 61 μm
Warping amount of 19th deposition mask: 57 μm Subsequently, as in the case of Example 1, the vapor deposition step was performed using the first to 19th deposition masks, thereby forming a deposition layer 92 on the electrode 93 on the substrate 91. In addition, the distance W1 between the position of the end portion of the electrode 93 and the position of the end portion of the uniform thickness portion 92a of the deposition layer 92 was measured. As a result, the maximum value of the distance W1 exceeded the first threshold. In addition, the width W2 of the shadow portion 92b was measured. As a result, the width W2 of the shadow portion 92b exceeded the second threshold.

As is understood from a comparison between Example 1 and Comparative Example 1, it was possible to improve the dimensional accuracy and positional accuracy of the deposition layer 92 by making the warping amount of the first supporting member 61 located closest to the intermediate position between the third portion 153 and the fourth portion 154 of the frame 15 larger than the warping amounts of the other supporting members.

The invention claimed is:

1. A mask support mechanism for supporting a deposition mask, comprising:
   a frame including a first portion, a second portion facing the first portion across an opening in a first direction, a third portion, and a fourth portion facing the third portion across the opening in a second direction different from the first direction, and including a first surface and a second surface that is located opposite to the first surface; and
   a supporter including a plurality of supporting members that are arranged in the second direction, the plurality of supporting members including a first end that is fixed to the first portion on the first surface and a second end that is fixed to the second portion on the first surface,
   wherein the plurality of supporting members include at least a first supporting member that is closest to an intermediate position between the third portion and the fourth portion of the frame and a second supporting member that is located closer to the third portion of the frame than the first supporting member, and
   when the first surface of the frame is located above the second surface, the first supporting member warps downward from the frame with a first preliminary warping amount, and the second supporting member warps downward from the frame with a second preliminary warping amount that is smaller than the first preliminary warping amount.

2. The mask support mechanism according to claim 1, wherein the plurality of supporting members include a third supporting member that is located closer to the fourth portion of the frame than the first supporting member, and
   when the first surface of the frame is located above the second surface, the third supporting member warps downward from the frame with a third preliminary warping amount that is smaller than the first preliminary warping amount.

3. The mask support mechanism according to claim 2, wherein the plurality of supporting members include a fourth supporting member that is located closer to the third portion of the frame than the second supporting member and a fifth supporting member that is located closer to the fourth portion of the frame than the third supporting member, and when the first surface of the frame is located above the second surface, the fourth supporting member warps downward from the frame with a fourth preliminary warping amount that is smaller than the second preliminary warping amount, and the fifth supporting member warps downward from the frame with a fifth preliminary warping amount that is smaller than the third preliminary warping amount.

4. The mask support mechanism according to claim 1, where each of the supporting members has a thickness of 50 µm or more.

5. The mask support mechanism according to claim 1, wherein each of the supporting members has a thickness of 1 mm or less.

6. The mask support mechanism according to claim 1, wherein the frame has a third surface facing the opening, which is located between the first surface and the second surface, and the third surface of the first portion at a position where the first portion overlaps the first supporting member in plan view is located closer to the second portion than the third surface of the first portion at a position where the first portion overlaps the second supporting member in plan view.

7. The mask support mechanism according to claim 1, wherein the first portion and the second portion of the frame are shorter than the third portion and the fourth portion of the frame.

8. The mask support mechanism according to claim 1, wherein a ratio of a length of the third portion and the fourth portion to a length of the first portion and the second portion is 1.1 or more.

9. A manufacturing method for display device, comprising:

a step of preparing a deposition mask apparatus including the mask support mechanism according to claim 1 and a deposition mask including a third end fixed to the third portion and a fourth end fixed to the fourth portion, and a step of performing vapor deposition of deposition material on a substrate using the deposition mask apparatus.

* * * * *